United States Patent
Rao et al.

(10) Patent No.: US 11,550,705 B2
(45) Date of Patent: Jan. 10, 2023

(54) SYSTEM AND METHOD FOR PERFORMING END-TO-END SIMULATION AND TESTING OF AN IOT APPLICATION

(71) Applicant: Larsen & Toubro Infotech Ltd, Mumbai (IN)

(72) Inventors: Nrk Rao, Navi Mumbai (IN); Meena Malu, Pune (IN); Rex Jesudas P, Chennai (IN)

(73) Assignee: Larsen & Toubro Infotech Ltd, Mumbai (IN)

( * ) Notice: Subject to any disclaimer, the term of this patent is extended or adjusted under 35 U.S.C. 154(b) by 0 days.

(21) Appl. No.: 17/359,478

(22) Filed: Jun. 25, 2021

(65) Prior Publication Data

US 2022/0365868 A1 Nov. 17, 2022

(51) Int. Cl.
*G06F 11/36* (2006.01)

(52) U.S. Cl.
CPC ...... *G06F 11/3688* (2013.01); *G06F 11/3612* (2013.01); *G06F 11/3664* (2013.01); *G06F 11/3684* (2013.01); *G06F 11/3692* (2013.01)

(58) Field of Classification Search
CPC ............ G06F 11/36–3696; G06F 8/77; G06Q 10/063–06398
See application file for complete search history.

(56) References Cited

U.S. PATENT DOCUMENTS

| | | | | |
|---|---|---|---|---|
| 5,963,731 A * | 10/1999 | Sagawa | .................... | G06F 30/23 719/310 |
| 7,496,658 B2 * | 2/2009 | Southam | ............... | H04L 67/563 709/224 |
| 7,607,169 B1 * | 10/2009 | Njemanze | ............... | G06F 11/32 726/22 |
| 9,874,870 B2 * | 1/2018 | Law | .................... | G06F 11/3636 |
| 2005/0010661 A1 * | 1/2005 | Southam | ............... | H04L 67/563 709/224 |
| 2011/0054643 A1 * | 3/2011 | Law | .................... | G06F 11/3636 700/83 |
| 2020/0065123 A1 * | 2/2020 | Yang | ....................... | G06F 9/455 |
| 2021/0209006 A1 * | 7/2021 | Nanjappan | .......... | G06F 11/3664 |
| 2022/0075708 A1 * | 3/2022 | Saha | ....................... | G06F 9/455 |

* cited by examiner

*Primary Examiner* — Todd Aguilera
(74) *Attorney, Agent, or Firm* — Mark Farrell; Farrell Patent Law PC

(57) ABSTRACT

The invention relates to a system (300) and method for performing end-to-end simulation and testing of an IoT application (102). An IoT data simulator (310) is configured to simulate an IoT environment using data received from different components in the IoT environment, which include IoT messages/data from IoT devices (106), master data from different databases (108) and data from third-party web services (110). Device templates are created that are used as blueprint for defining a plurality of device instances which include simulated device instances and live device instances. An IoT application validator (326) is configured for testing and validating the IoT application (102) by transmitting a plurality of IoT messages to the IoT application (102) and validating the behavior of the IoT application (102) to the plurality of IoT messages for all layers including, but not limited to, a UI layer (112), a business logic (114) and a data layer (116), using one or more device instances.

27 Claims, 20 Drawing Sheets

Edit Device Templates

Device Template Details

Device Template Name
Supraeco T-2 (22-48 kW)

ID
Supraeco T-2 (22-48 kW)

Device Template from existing device template
No

Description
Device for truck simulator.
Attributes are:
1. Engine Temperature
2. Speed
3. Fuel Tags
Truck, Engine, Fuel

| Attributes | Messages | | | | Add New Attribute |
|---|---|---|---|---|---|
| S.NO | Attribute Name | Description | Value Type | Unit of Mesurement | |
| 01 | Engine Temperature | Reference data source from... | Numeric | Degree Celsius | Data Rule |
| 02 | Speed | Reference data source from... | Numeric | kmph | Data Rule |
| 03 | Fuel | Reference data source from... | Numeric | L | Data Rule |

Cancel    Save

| Scenario Name |
|---|
| A312468 |

| Description |
|---|
| This scenario is for testing purpose-Created |

| Tags |
|---|
| System, Configure |

| search by name | 1 Jan 2020, 12:00 - 10 Jan 2020, 18:00 | 📅 | Filter ▼ Control Simulations Last: 01 Jan 2020 12:00... | 1 Time Run | Start |
|---|---|---|---|---|---|

Execution Run ID: 0101
Execution Run Start End Time
01 Jan 2019, 12:00 - 02 Jan 2019 12:00     Passed ⟩

Iteration ID: 2131
Iteration Start End Time
01 Jan 2019, 12:00 - 01 Jan 2019 18:00

12:00    Device Info
    01 Jan 2019   A312468

13:30    Outputs
    01 Jan 2019   A312469

18:00    Outputs        Delayed by 1 Hr
    01 Jan 2019   AA2514

20:00    Data Generated
    01 Jan 2019   AC125

23:00    Data Generated       Failed ⟩
    01 Jan 2019   AC125

Iteration ID: 2132
Iteration Start End Time
01 Jan 2019, 12:00 - 01 Jan 2019 18:00

23:00    Data Info
    02 Jan 2019   AC125

Execution Run ID: 0101
Iteration ID: 2131
Iteration Start End Time
01 Jan 2019, 12:00 - 01 Jan 2019 18:00

Condition Logic        Passed

Select Message
Temperature

View More ⟩

Device Message       Passed

Application ID
109878

Select Message
Temperature

JSON

Device ID       ⟩
ABZ_01

| Cancel | Add |
|---|---|

*FIG. 13*

SYSTEM AND METHOD FOR PERFORMING END-TO-END SIMULATION AND TESTING OF AN IOT APPLICATION

FIELD OF THE INVENTION

The invention generally relates to end-to-end testing and validation of Internet-of-Things (IoT) systems or applications. Specifically, the invention relates to a system and method for performing end-to-end simulation of an IoT environment and validating an IoT application logic and behavior in different layers, front-end to backend along with its interfaces and endpoints.

BACKGROUND OF THE INVENTION

Internet-of-Things (IoT) technology has seen widespread development and adoption in numerous applications and domains. With the rapid expansion of the IoT ecosystem, there is a need to ensure that IoT applications are continuously and thoroughly tested before deployment in the connected space.

Testing of IoT applications provides an integrated approach to validate practical as well as non-functional requirements of IoT solutions. Erstwhile testing solutions come with their own set of challenges which include, but need not be limited to, manual intervention at each stage of the testing, requirements of complex use cases and real-time responsiveness, and lack of a generic testing framework to support the diversity of IoT applications and devices, including different IoT protocols to be tested and a large number of sensor interactions.

To deal with the aforesaid issues, some of the existing testing frameworks include features such as, but not limited to, protocol simulators, data recorders and virtualization. Protocol simulators enable working with multiple protocols and is beneficial when there is variation in the device endpoints and their interfaces. Data recorders help in smart validation across device sets and the recorded data can be played across different device endpoints automatically, which in turn can be a great enabler in compatibility testing of applications across different device sets and communication layers. However, the highly complex nature of the IoT ecosystem makes real-time validation of the application behavior quite difficult and time-consuming.

Furthermore, considering end-to-end testing of applications, this testing methodology tests an application by checking the functional flow of the application from start to end. This testing phase ensures that a behavioral flow of an application is as expected or satisfies certain requirements by performing a thorough testing from the beginning to the end considering the different components and the interactions between the components and product-to-user interactions, thereby detecting any deficiencies in the workflow of the application.

In an IoT environment, however, an application is interconnected and integrated with multiple systems, either similar or disparate, within or external to the application environment. Thus, the entire workflow of an IoT-based application is complex and performing end-to-end testing on such applications is challenging as the application must be tested from all layers—from the front-end to backend along with its interfaces and endpoints.

Thus, there exists a need for a method and system to perform end-to-end simulation and testing of IoT applications and to validate the IoT application logic and behavior against vendor defined specification.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the invention.

FIG. 7b is part II of the flow diagram of FIG. 7a.

FIG. 11 illustrates a device template screen in accordance with an embodiment of the invention.

FIG. 12 illustrates a message definition screen in accordance with an embodiment of the invention.

FIG. 13 illustrates a scenario definition screen in accordance with an embodiment of the invention.

Figure 1:
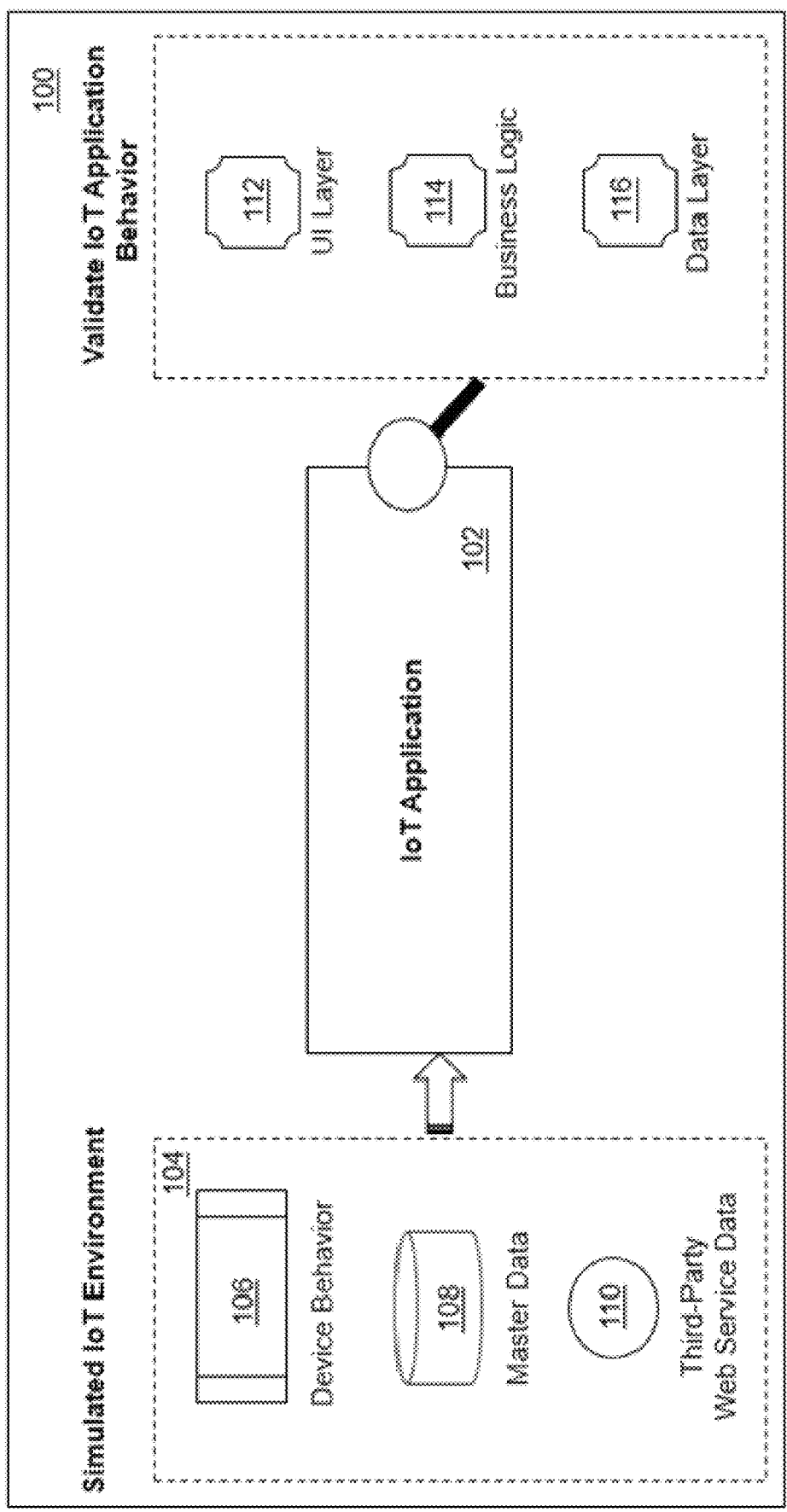
FIG. 1 is a schematic of an IoT ecosystem for end-to-end testing of an IoT application in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the invention, it should be observed that the embodiments reside primarily in combinations of method steps and system components for performing end-to-end simulation of an IoT environment and validating an IoT application logic and behavior in different layers, front-end to backend along with its interfaces and endpoints.

Accordingly, the system components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Various embodiments of the invention disclose a system and method for performing end-to-end testing of an IoT application. The system comprises an IoT data simulator configured to simulate an IoT environment using data received from different components in the IoT environment. These include IoT messages/data from IoT devices, master data from different databases and data from third-party web services. A connection management module enables the IoT data simulator to communicate with the different components or systems to simulate the IoT environment. The system is further configured to create device templates that are used as blueprint for defining a plurality of device instances. These device instances include, but need not be limited to, simulated device instances and live device instances. The system further includes an IoT application (app) validator for testing and validating the IoT application. To test the IoT application, the IoT app validator transmits a plurality of IoT messages to the IoT application and validates the behavior of the IoT application to the plurality of IoT messages using one or more device instances. The plurality of IoT messages may be simulated IoT messages coming from the simulated IoT environment or may be live messages transmitted from live devices/sensors. The plurality of IoT messages are transmitted in various formats such as, but not limited to, JAVASCRIPT Object Notation (JSON) format, a Comma Separated Values (CSV) format and a Protocol Buffers (ProtoBuf) format. The IoT app validator validates the IoT application behavior from start to end, for all layers including, but not limited to, a User Interface (UI) layer, a business logic and a data layer.

In accordance with an embodiment, device instances are defined based on IoT device attributes and properties, a message structure and a plurality of rules. The plurality of rules can be, but need not be limited to, value generation rules and message transmission rules.

The value generation rules are set for attributes, properties or message parameters. The value generation rules define how values for primitive data types such as String, Boolean or Numeric are to be generated. Further, the primitive data types enable defining composite data types.

The message transmission rules are set to define the conditions for IoT messages that are generated, published and transmitted from the system. The message transmission rules create an interlinking between the IoT messages, which triggers a definite sequence of transmitting one or more IoT messages based on the transmitting of one or more preceding IoT messages. The trigger happens based on detecting existence of any condition in the one or more preceding IoT messages.

In accordance with another embodiment, the IoT data simulator is configured to define multiple data simulation paths. The data simulation paths include external input data sources and output data sinks. The IoT data simulator transforms incoming data based on one or more selected data simulation paths and one or more transformation rules. This data is either read from one or more external input data sources or may be generated using value generation rules.

In accordance with yet another embodiment, the IoT app validator enables a tester to create test scenarios and populate test data corresponding to the created test scenario. The test data include, but need not be limited to, device instances, data simulation paths and web services. The IoT app validator then selects IoT messages to be transmitted to the IoT application along with one or more parameter values and validates the IoT application using the test data.

In accordance with still yet another embodiment, the IoT app validator is configured to predict health of the IoT application. A tester can create a project corresponding to the IoT application, wherein the tester inputs a project start date and project end date. The tester is then enabled to create a plurality of device templates and test instances using the plurality of device templates. The tester is then enabled to create a plurality of test scenarios in accordance with the requirements of the IoT application. The plurality of test scenarios are executed at regular intervals to validate the IoT application against the requirements. A test scenario execution report is generated which includes test scenarios passing and failing at each sprint. Finally, the IoT app validator calculates, using an AI model, the health of the IoT application based on the project end date and a number of test scenarios that have failed, if the project completes on time. In an embodiment, the AI model, based on the execution of test scenarios and their failure rates, predicts the velocity of the project and thus can predict if the project can be completed on time or not. In another embodiment, the AI model predicts resolution for issues and possible root causes for the test steps which failed, based on the previously entered resolutions and the similar failures happening during the test scenario execution. In yet another embodiment, the AI model monitors the execution of test scenarios and based on the failure in the previous run, suggests to the tester a test group with all the test scenarios which enable regression testing of a new build.

In accordance with still yet another embodiment, the IoT app validator is further configured to validate a live IoT device. One or more device templates may be created based on an original equipment manufacturer's (OEM's) technical specification. The one or more device templates include, but need not be limited to, attributes, properties, message parameters and message structure along with message transmission rules. One or more live device instances are then created using the device templates. These live device instances are created to validate a live IoT device installed in field in accordance with the OEM's specification. A plurality of test scenarios are created for validating the one or more live device instances, which include test steps written as per the OEM's specification. The IoT app validator further checks if a device id in an incoming log is of a live device instance and identifies the test scenarios which contain the live device instance for validating the live device instances.

The IoT app validator is further configured to enable playback of IoT messages received from a live device instance and send the IoT messages back to the IoT application. Parameters such as, but not limited to, date range, date and time fields of an IoT message are selected to be updated during playback.

FIG. 1 is a schematic of an IoT ecosystem 100 for end-to-end testing of an IoT application 102 in accordance with an embodiment of the invention.

As illustrated in FIG. 1, IoT ecosystem 100 comprises a simulated IoT environment 104 which is created based on data retrieved by three components: device behavior data from a plurality of IoT devices 106, master data from a plurality of databases 108 and third-party web service data from a plurality of third-party web services 110.

Simulated IoT environment 104 interacts with IoT application 102 and based on the interaction, behavior of IoT application 102 is validated for all three layers: a UI layer 112, business logic 114 and a data layer 116.

Figure 2:
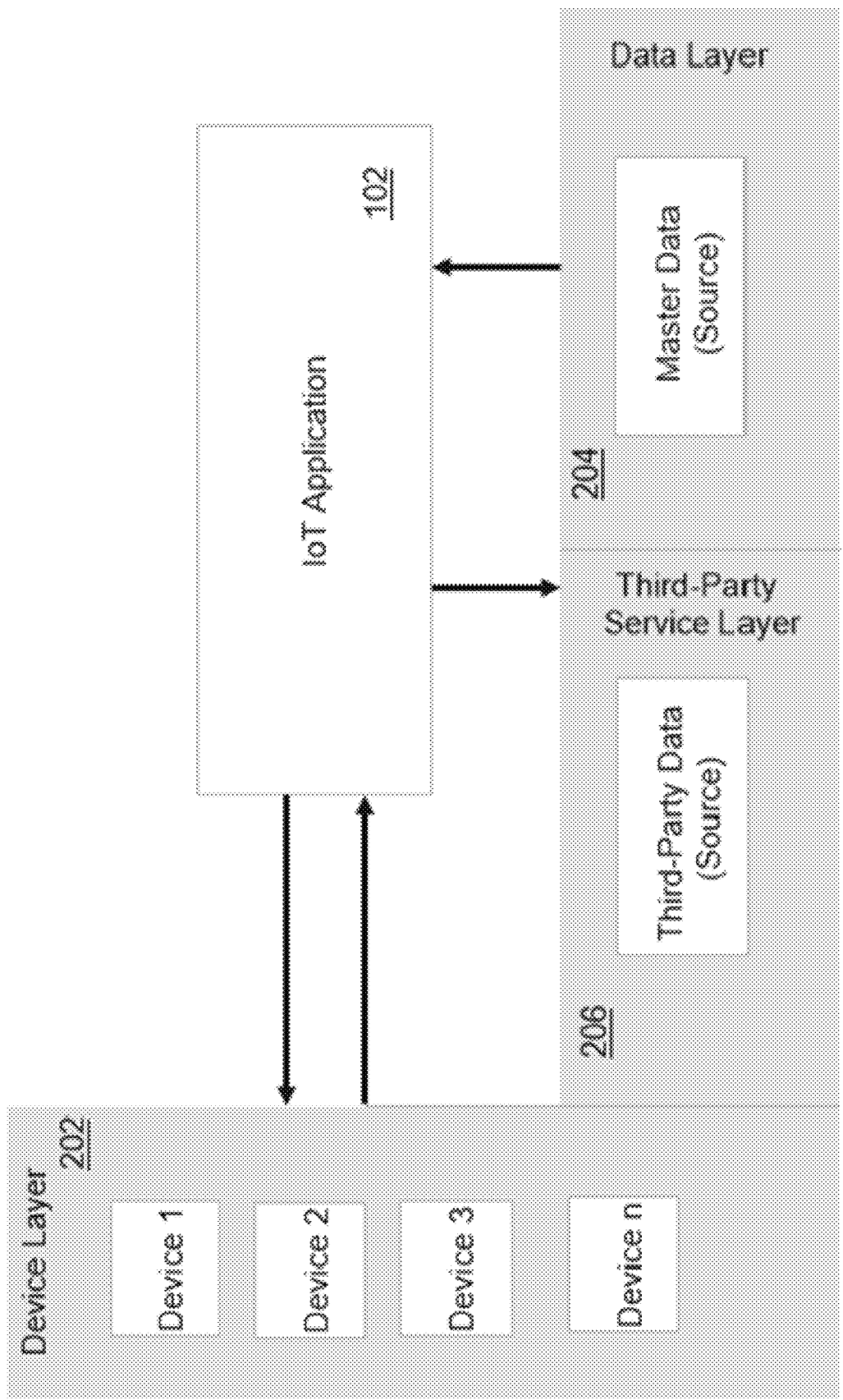
FIG. 2 is a schematic depicting simulation of the IoT environment for end-to-end testing of the IoT application in accordance with an embodiment of the invention.

FIG. 2 is a schematic depicting simulation of the IoT environment for end-to-end testing of IoT application 102 in accordance with an embodiment of the invention.

As illustrated in FIG. 2, the end-to-end testing of IoT application 102 requires simulation of all the three layers used/referred by IoT application 102: a device layer 202, a data layer 204 which includes referenced data and/or master data and a third-party service layer 206 (web service layer).

Figure 3:
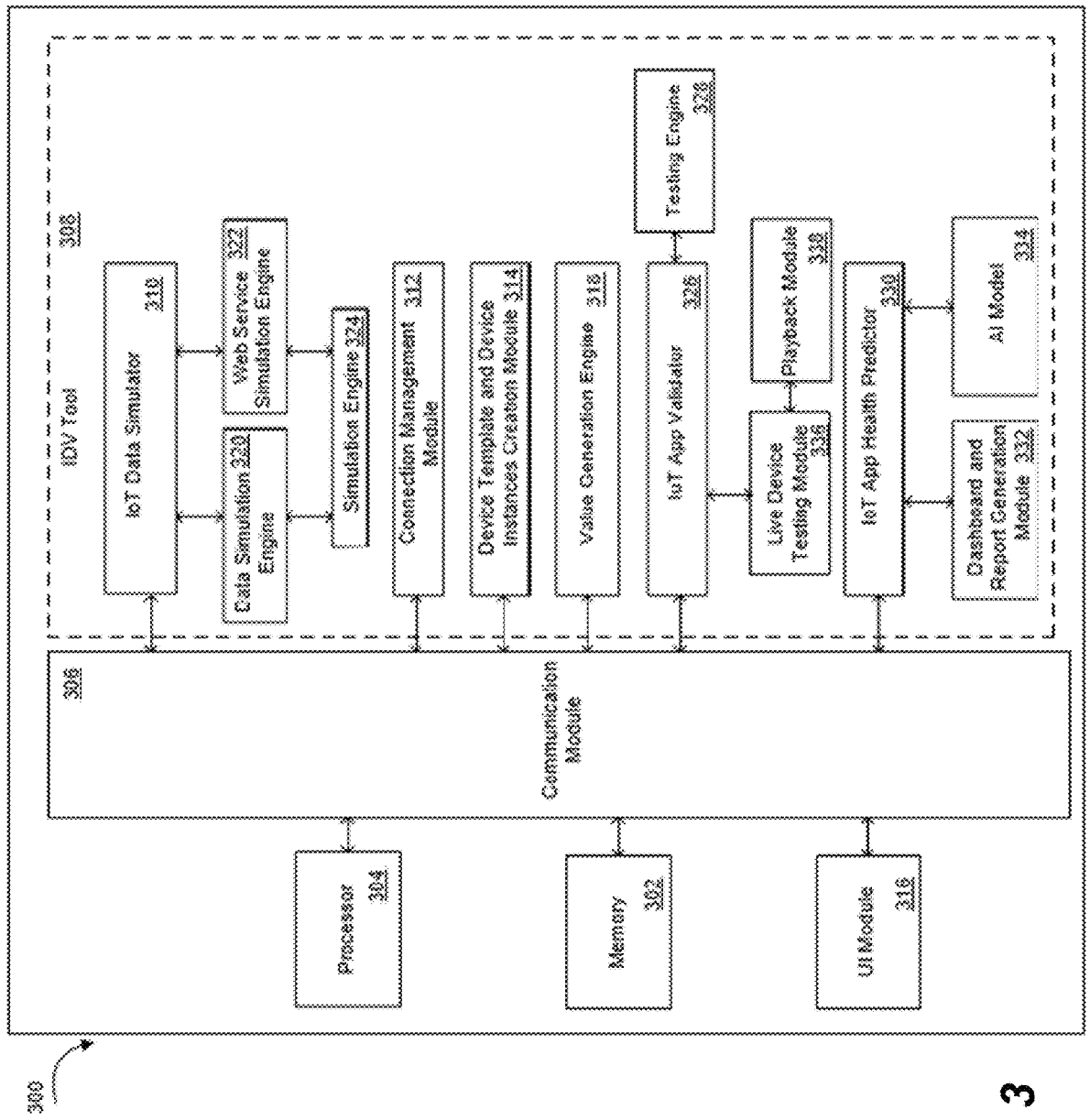
FIG. 3 illustrates a system for performing end-to-end simulation and testing of an IoT application in accordance with an embodiment of the invention.

FIG. 3 illustrates a system 300 for performing end-to-end simulation and testing of IoT application 102 in accordance with an embodiment of the invention.

As illustrated in FIG. 3, system 300 comprises a memory 302 and a processor 304 communicatively coupled to memory 302. Memory 302 and processor 304 further communicate with various modules of system 300 via a communication module 306.

Communication module 306 may be configured to transmit data between modules, engines, databases, memories, and other components of system 300 for use in performing the functions discussed herein. Communication module 306 may include one or more communication types and utilizes various communication methods for communication within system 300.

System 300 includes an IoT data validation (IDV) tool 308 for performing end-to-end simulation and testing of IoT application 102. IDV tool 308 comprises an IoT data simulator 310 configured to simulate an IoT environment using data received from different components in the IoT environment. The data includes, but need not be limited to, IoT messages/data from IoT devices 106, master data from different databases 108 and data from third-party web services 110.

A connection management module 312 enables IoT data simulator 310 to communicate with the different components or systems to simulate the IoT environment.

Connection management module 312 is a core module of IDV tool 308 which enables IDV tool 308 to communicate with various other systems to simulate the IoT environment. The communication settings for connection management module 312 may be broadly categorized into the following: IoT connections, database connections, and web service connections, the details of which are described as follows.

IoT application 102 has one ingestion point through which IoT application 102 receives device messages. This can be an IoT platform such as, but not limited to, AZURE IoT hub, AWS IoT core, protocol broker server such as Message Queuing Telemetry Transport (MQTTENGINE) broker, Advanced Message Queuing Protocol (AMQP) broker, event hub endpoint, and KAFKA endpoint. Based on the ingestion point used by IoT application 102, a tester is allowed to configure IDV tool 308 which will be specific to the ingestion point. For example, MQTT broker consists of a server IP address, a port number, certificates, and topic name. Similarly, AZURE IoT hub has primary connection string details and so on.

Apart from the device messages, IoT application 102 also depends on the master data which can be related to the asset provisioning details, user roles, accessibility details, maintenance details and so on. To perform an end-to-end testing, it is important to also create data layer 204 for IoT application 102. There can be different types of master data retrieved from databases such as, but not limited to, a relational database or a no-SQL database. Database connection details are specific to a database engine that is selected such as, but not limited to, PostgresSQL server IP address, port number, and user credentials.

There may be scenarios where IoT application 102 under test may require access to third-party data sources such as, but not limited to, weather data, Key Performance Indicator (KPI) calculations and so on. It is critical for IDV tool 308 to provide capability to simulate the web service endpoints, the web service URL, authentication methods such as, but not limited to, OAUTH 2.0, Basic AUTH, and Transport Layer Security (TLS), method type such as, but not limited to, PUT, POST, and GET, header parameters, and message body.

IDV tool 308 further includes a device template and device instances creation module 314 which is configured to create device templates that are used as blueprint for defining a plurality of device instances. These device instances include, but need not be limited to, simulated device instances and live device instances.

Device templates are created as a blueprint for the simulated device instances and are defined based on the sensor vendor specification document. A device template can be created using a UI module 316 of system 300 or can be uploaded as a JSON text file in IDV tool 308.

Device templates can inherit from a previously defined device template so that the new template will inherit all the attributes and messages from the parent template and a user can add the additional attribute/messages or delete/modify an existing attribute and create a completely new template. This accelerates the creation of new device templates by leveraging already defined device template definitions.

Based on the type of device instance, appropriate functionality within IDV tool 308 are enabled. For instance, simulated device instances can be used for functions such as, but not limited to, simulation, test case scenarios, load testing and so on, whereas live device instances are used for verifying incoming messages, playback feature, validation of OEM devices and so on.

Simulated device instances are created based on an existing device template and wherever required device instance specific parameters are updated such as, but not limited to, model number, asset ID, and location information. In an embodiment, bulk creation of simulated device instances is supported using CSV file upload technique.

Simulated device instances can be configured with connection details to communicate with various IoT platforms such as, but not limited to, Azure IoT, AWS IoT, GOOGLE CLOUD Platform (GCP), and THINGWORX.

Figure 4:
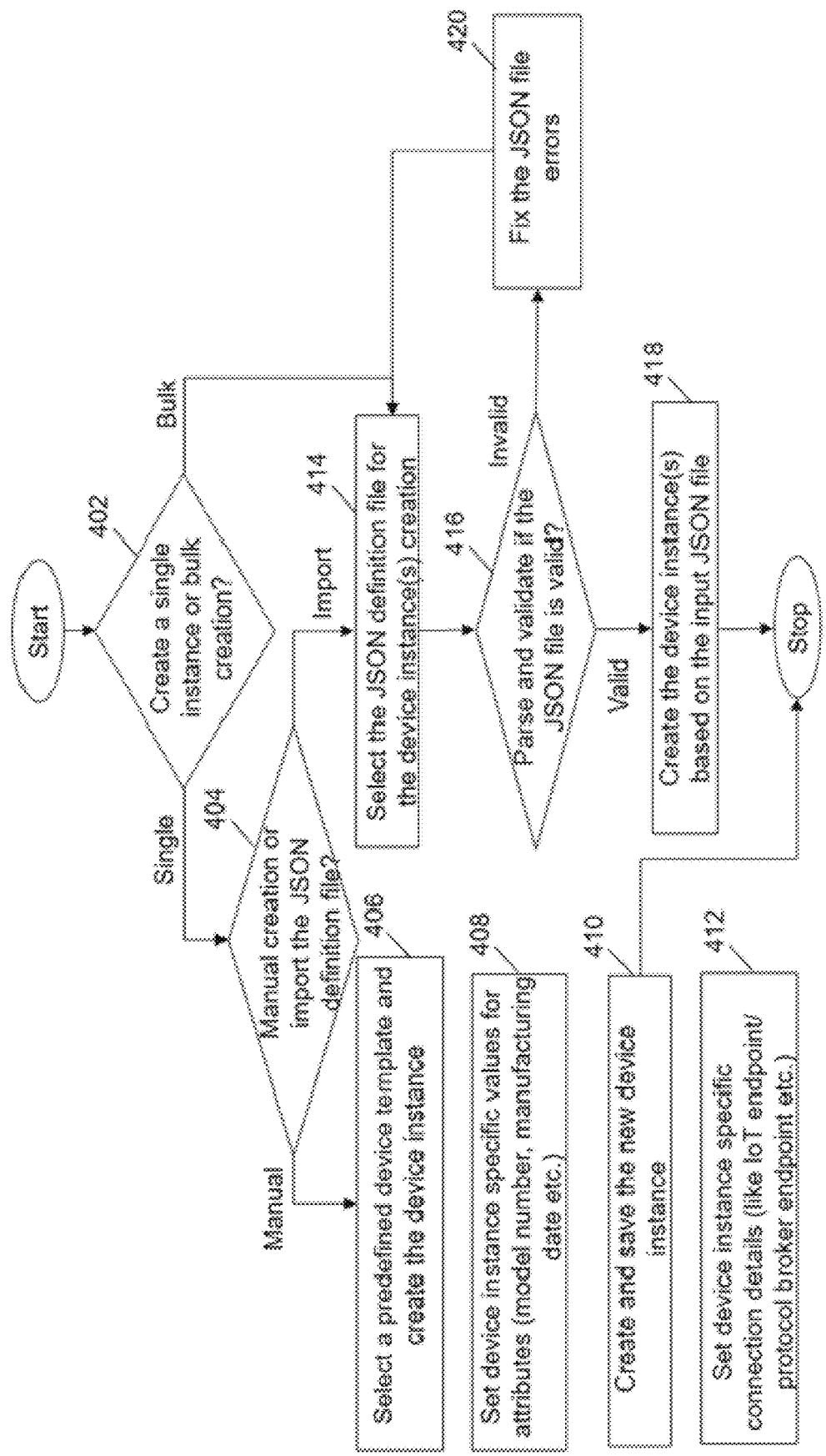
FIG. 4 illustrates a process flow diagram of a method for creating simulated device instances in accordance with an embodiment of the invention.

The process of creating simulated device instances is further illustrated in conjunction with FIG. 4.

Live device instances are also created based on a predefined device template. The live device instances are created using UI module 316 (UI screen), which is exactly same as the process of creating a simulated device instance except that a live device flag is enabled, which indicates that the device instance type is of type live device. Bulk creation is also supported using a JSON file upload technique.

In accordance with an embodiment, device instances are defined based on IoT device attributes and properties, a message structure and a plurality of rules. The plurality of rules can be, but need not be limited to, value generation rules and message transmission rules.

Attributes include device parameters which generally do not change for an instance (such as, but not limited to, model number, and manufacturing date) and properties which change (such as, but not limited to, speed, engine run state, and fuel level).

UI module 316 enables a user to define the message structure and provides the capability to the user to define the structure in JSON format with all its features which includes, but is not limited to, defining an array and an object. The message structure can be defined using UI module 316, or the user can simply upload an existing JSON file and IDV tool 308 parses, validates and uses the file as the message definition structure. Although, UI module 316 depicts the message in JSON format, IDV tool 308 allows the user to select the format in which IoT data simulator 310 should generate the message. IDV tool 308 can generate messages in the following formats, JSON, CSV and ProtoBuf.

Apart from the message structure, for each of the KEYs mentioned in the message structure, the user can also specify how the value needs to be generated before the message is created and sent. The user can select a particular KEY in the message structure and then specify the method to be used to populate it with, such as, but not limited to, a current value of a particular device parameter or a device attribute, a constant value, an output of a value generation rule, and current date and time values.

System 300 includes a value generation engine 318 for generating values using the value generation rules. The value generation rules are set for attributes, properties or message parameters. The value generation rules define how values for primitive data types such as String, Boolean or Numeric are to be generated. Further, the primitive data types enable defining composite data types. For example, a user can create a custom rule to generate an address data type (composite data type) which consists of two address lines, Address Line 1 and Address Line 2 (defined using String rule type) and one PIN code (defined using Numeric rule type). Value generation engine 318 is further described in detail in conjunction with FIG. 5.

The message transmission rules are set to define the conditions for IoT messages that are generated, published and transmitted from IDV tool 308. The message transmission rules create an interlinking between the IoT messages, which triggers a definite sequence of transmitting of one or more IoT messages based on the transmitting of one or more preceding IoT messages. The trigger happens based on detecting existence of any condition in the one or more preceding IoT messages.

The message transmission rules are set to define the conditions of IoT messages generated and published, mostly as defined by an OEM of a device. For example, the conditions that may be defined include, but need not be limited to, the rate at which the IoT messages will be sent such as, for example, every 2 seconds, once every hour/day/week/month/year or during a specific time frame of the day (for example, morning 9 am-12 noon) or a specific time of the day (for example, 10:30 am).

The message transmission rules can also be defined to create interlinking between two messages. For instance, if Message A with parameter "xyz" value greater than 10 is sent, then a device should also send out Message B with parameter "mno" value as 20 and so on. In another instance, as per the device specification, if a temperature parameter in Message A is greater than a threshold value 'X', then the device should also emit a Message B. In an instance, the parameters of a message are checked for the following conditions, ">", ">=", "=", "<", "<=", "==". There can be multiple conditions defined for the IoT messages.

In accordance with another embodiment, IoT data simulator 310 includes a data simulation engine 320 and a web service simulation engine 322. Data simulation engine 320 is configured to define multiple data simulation paths. The data simulation paths include external input data sources and output data sinks. Data simulation engine 320 transforms incoming data based on one or more selected data simulation paths and one or more transformation rules. The data is either read from one or more external input data sources or may be generated using value generation rules. Data simulation engine 320 is further described in detail in conjunction with FIG. 6.

Web service simulation engine 322 is configured to simulate third-party web services accessed by IoT application 102 due to various reasons such as, but not limited to, the service being paid for and when the same has not been approved yet by internal IT teams/procurement teams or the web services are exposed by a different department and the approval process takes a long time. For simulating a web service, a user needs to specify the following attributes: an access URL, a method name, header parameters, request parameters and their validation and the response body.

Access URL: The base URL remains the same for all Application Programming Interfaces (APIs), however the endpoints, which mostly refer to the entity, need to be accessed by enabling the user to specify attributes such as, but not limited to, asset name and weather. The endpoint name needs to be unique across IDV tool 308.

Method name: A user can select one of the four methods: GET/POST/PUT/DELETE.

Header parameters: A user can specify the header parameters that are expected and the validation rules that are to be performed on the header parameters for incoming requests.

Request parameters and their validation: A user can specify the JSON structure of a request parameter (in case of POST and PUT). For each of the KEYs present in the request JSON, the user can also specify verification rules such as, but not limited to, 'Is the KEY Mandatory', and what values are allowed such as allowing the user to specify an array of allowed strings.

Response body: The user can specify the JSON structure of the response body. UI module 316 allows the user to define the JSON structure in a user-friendly manner, with all its features which includes, but is not limited to, defining an array and an object. The message can be defined using UI module 316, or the user can simply upload an existing JSON file and IDV tool 308 parses, validates and uses the file as the response body structure.

Apart from the response body structure, for each of the KEYs mentioned, the user can specify how the value needs to be generated before a response is created and sent. The user can select a particular KEY in the response body structure and then specify the method to be used to populate the response body structure with the following parameters: a current value of a particular device parameter or a device attribute, a constant value, an output of a value generation rule, current date and time values.

The logic to populate a response message can also depend on the request parameters, and the user can also specify rules, such as, for example, if request body with key XYZ is received with value 10, then Value Generation Rule −1 is to be applied for generating MNO parameter value in the response message, whereas if the request body with key XYZ is received with value 20, then Value Generation Rule −2 should be applied for generating MNO parameter value in the response message.

Sometimes, web service simulation engine 322 also needs to simulate error conditions. The user can specify the error responses to be sent for each of the web service endpoints and methods. The rules can also be defined based on the request parameter values such as for example, if request message with parameter XYZ is received with value <0, then 400 bad request needs to be sent. For a single endpoint and method name combination, multiple error responses can be sent. Error messages can also be sent out randomly based on user settings, to simulate live conditions.

IoT data simulator 310 further includes a simulation engine 324 for triggering the simulation.

Simulation is one of the critical functionalities of IDV tool 308 which can be used just as a simulator also. Simulations can be started for one or all layers (device, data and service layer) at the same time using simulation engine 324.

If individual simulations need to be done, the user can open appropriate sections in IDV tool 308 to start the simulation. These sections include, 'Only Device Simulation', 'Only Data Simulation', 'Only Web Service Simulation', 'Creating A Simulation Job', and using 'Settings' option in the 'Simulation' section.

Only Device Simulation: For simulating a device, the user must open the simulated device instance and press the 'Simulate' button. IDV tool 308 then starts sending messages to IoT application 102 (using the connection string) based on the message definitions and message transmission rules.

The user can also select multiple device instances (via a device instance listing screen of UI module 316) to trigger the simulation process for all at once. The simulation option is only available for simulated device instances and not for live device instances. The simulation is then executed until it is stopped. The steps for the simulation are enumerated as follows:

To start with, select the 'Device' section of IDV tool 308. From the 'Device Instance List' page, select one or more devices and press the 'Start Simulation' button.

Simulation engine 324 starts simulating all the selected device instances based on the message definitions and message transmission rules. The status of the simulation run may be monitored in the 'Simulation' tab of the 'Device' section, which may provide the status such as, but not limited to, simulation run currently executing or stopped, and how many messages were sent.

In case more detailed information of the simulation run for an instance must be found, the user can open the device instance and go to the 'Simulation' tab to see the actual message body with parameter values being sent.

The user can stop the simulation of a single device from within the 'Device Instance' screen or can stop the simulation of multiple device instances from 'Device Instance Listing' page. The device simulation is executed until the user presses the 'Stop Simulation' button.

Only Data Simulation: The steps for the simulation are enumerated as follows:

To start with, select the 'Data' section of IDV tool 308. From the 'Data Simulation Path List' page, select a data path to be executed. Usually a single path is selected, but IDV tool 308 allows the user to select multiple data simulation paths and executes these selected paths.

The status of the data simulation path can be monitored in the 'Simulation' tab of the 'Data' section, which provides the status such as, but not limited to, simulation run currently executing or stopped, and how many rows were inserted.

In case more detailed information of the simulation run for a data simulation path must be found, the user can open the device simulation path and go to 'Simulation' tab to see the actual data being inserted into tables/files.

The user can stop the simulation of a single data simulation path from within the 'Data Simulation Path' screen or can stop the simulation of multiple data simulation paths from the 'Data Simulation Path Listing' page. The data simulation is executed until the user presses the 'Stop Simulation' button.

Only Web Service Simulation: Simulation of a web service means just enabling or disabling a web service simulation. For enabling a web service simulation, the user must open the 'Web Service' section of the tool and select all the services which should start accepting client requests. In case if any web service simulation needs to be stopped, the user can just disable it by selecting the 'Toggle' button, and the web service stops processing incoming requests.

Creating a Simulation Job: In scenarios where the requirement is to simulate the complete environment for IoT application 102 and not just device simulation, the user can use the 'Simulation Section' of IDV tool 308.

Under 'Simulation' section, the user can first create a 'Simulation Job'. For the created simulation job, the user can create the required simulation blocks within the simulation job. For instance, if the user wants to create an environment for IoT application 102 which simulates all three layers such as device, data and web service layers, then within the newly created simulation job, the user can create a device simulation block, a data simulation block and a web service simulation block. Within the newly created device simulation block, the user can add all the device instances which were already created and need to be part of the simulation job. Within the newly created data simulation block, the user can add all the data simulation paths which were already created and need to be part of the simulation job. Within the newly created web service block, the user can select all the web service instances which were already created and need to be part of the simulation j ob.

Once the simulation job is created with the required simulation blocks and saved, it can be viewed in 'Simulation Jobs Listing' page under 'Simulation' section of IDV tool 308. Each simulation job needs to contain at least one simulation block. The steps for the simulation are enumerated as follows:

To start the simulation job, the user must select a simulation job and press the 'Start Simulation' button. The listing page visually depicts the status of running simulation jobs. The user can select and view the simulation job to know the detailed execution status of the job.

Each block displays the list of its entries. For example, a device block shows a list of device instances and their running state and a data block shows the list of data simulation paths and their state. In order to know the exact state of the entity in a block, the user can select and view the entity in the block. For example, to view the details of a device simulation, the user can click on the device instance in the device block to view exactly the messages and the parameters being sent.

The user can stop the simulation job by opening it and then pressing the "Stop Simulation" button or just selecting the simulation job from the 'Job Listing' page and pressing the "Stop Simulation" button. The user can also update existing simulation jobs by selecting it from the 'Simulation Job Listing' page in the 'Simulation Section' of IDV tool 308.

Figure 7A:
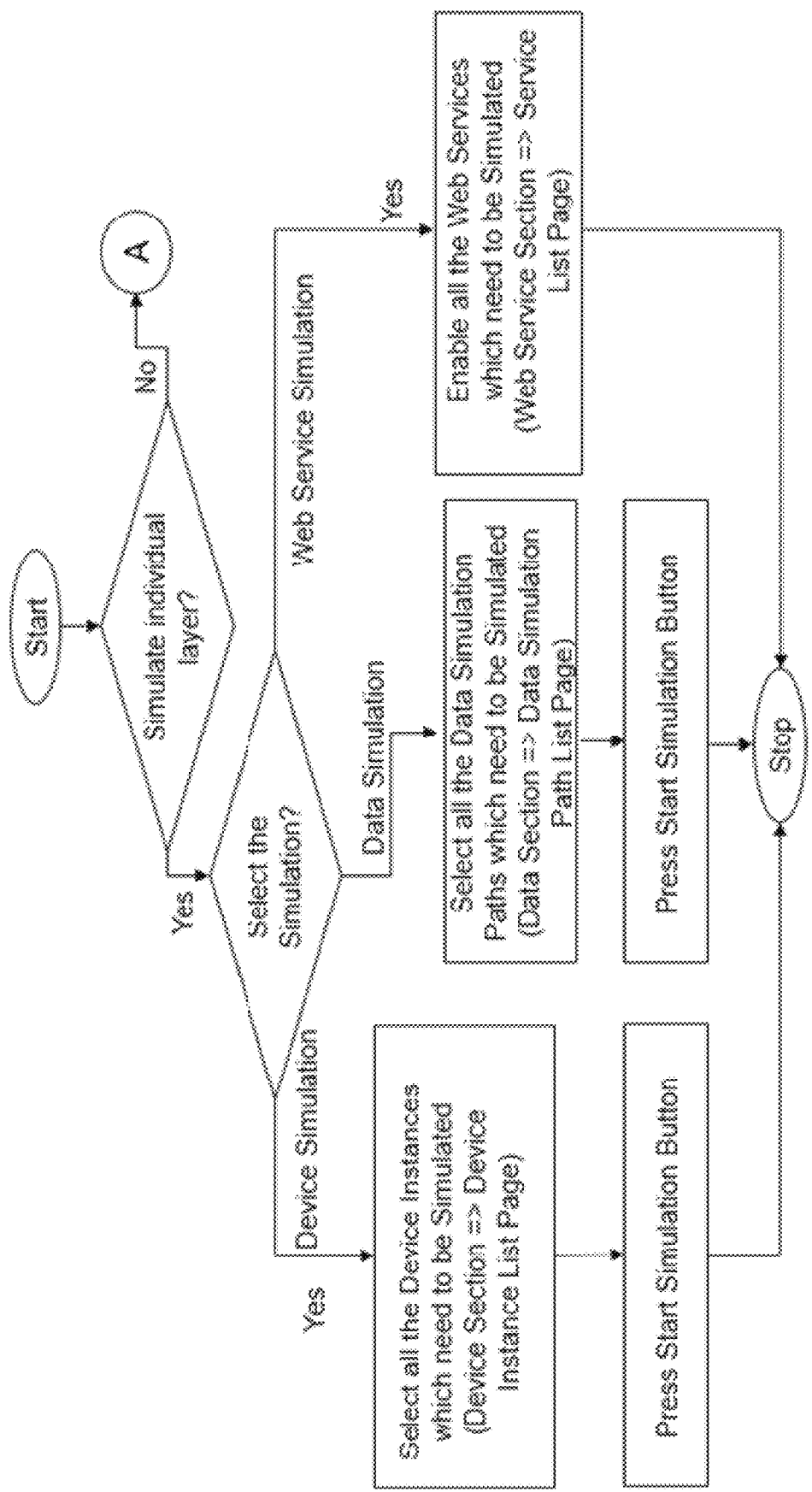
FIG. 7a is a flow diagram illustrating a simulation 'start' process in accordance with various embodiments of the invention.
Figure 7B:
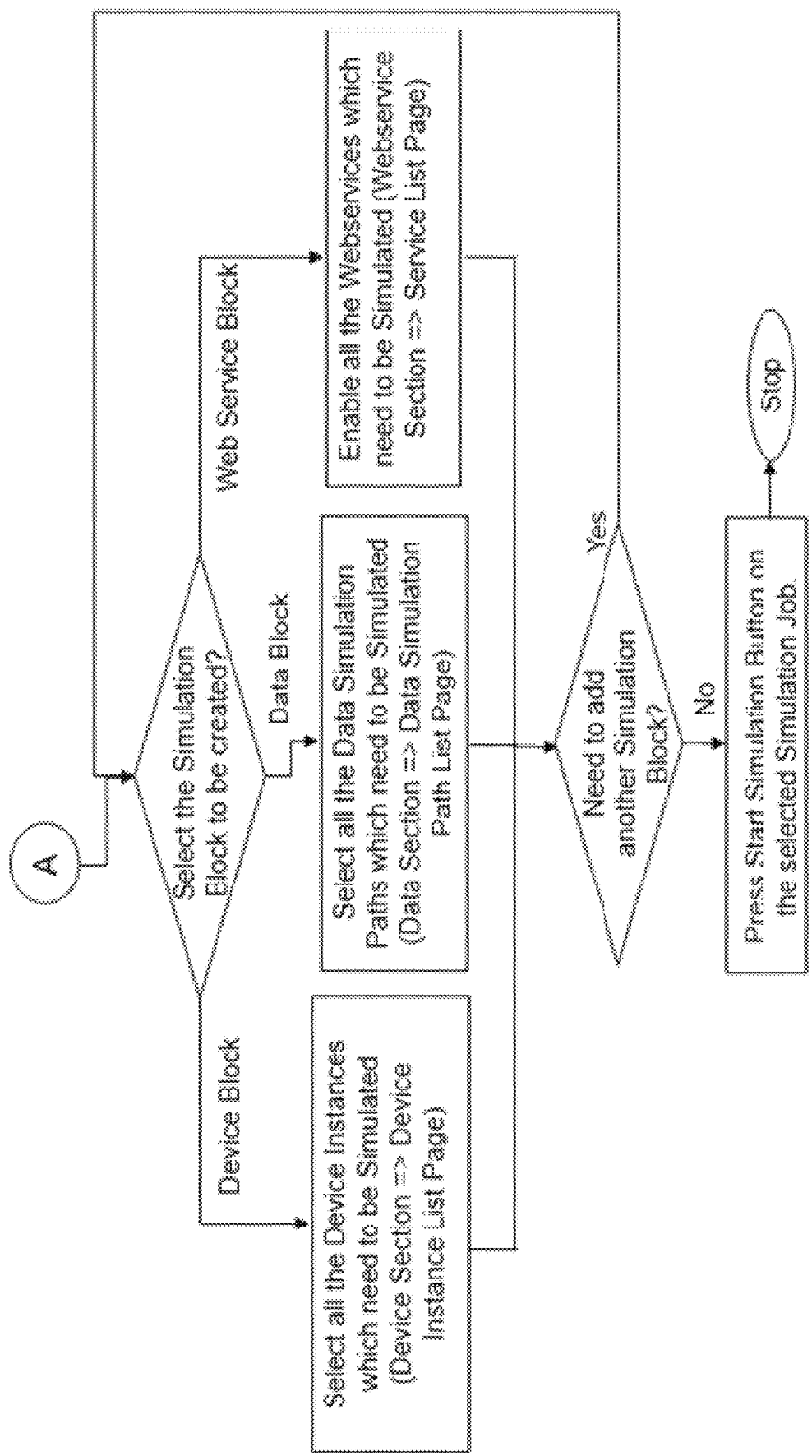

FIG. 7a and FIG. 7b are flow diagrams illustrating the simulation 'start' process in accordance with various embodiments of the invention.

Using 'Settings' Option in the 'Simulation' Section: The user can provide the archiving time for the output data, such as how much data must be made available to the user. The data older than the limit set by the user is deleted.

IDV tool 308 further includes an IoT app validator 326 for testing and validating IoT application 102. To test IoT application 102, IoT app validator 326 transmits a plurality of IoT messages to IoT application 102 and validates the behavior of IoT application 102 to the plurality of IoT messages using one or more device instances. The plurality of IoT messages may be simulated IoT messages coming from simulated IoT environment 104 or may be live messages transmitted from live devices/sensors. The plurality of IoT messages are transmitted in various formats such as, but not limited to, JSON format, a CSV format and a ProtoBuf format. IoT app validator 326 validates IoT application 102 behavior from start to end, for all layers including, but not limited to, UI layer 112, business logic 114 and data layer 116.

In accordance with yet another embodiment, simulation engine 324 of IDV tool 308 enables a user to perform random testing of IoT application 102. This kind of testing will not be enough to perform a thorough testing of IoT application 102. IoT applications are developed against a requirement specification and to verify that a developed IoT solution pertaining to IoT application 102 is satisfying all the requirements, IoT app validator 326 of IDV tool 308 allows a tester to write test scripts for testing IoT application 102 for each of the requirements.

IoT app validator 326 enables a tester to create test scenarios and populate test data corresponding to the created test scenario using a testing engine 328. The test data include, but need not be limited to, device instances, data simulation paths and web services. Testing engine 328 selects IoT messages to be transmitted to IoT application 102 along with one or more parameter values and validates IoT application 102 using the test data. A test scenario creation process is further illustrated in conjunction with FIG. 8.

In accordance with still yet another embodiment, IDV tool 308 is configured to predict health of IoT application 102 using an IoT app health predictor 330.

In a first step, a tester uses IDV tool 308 to create a project. While creating the project, the tester provides various details about the project such as, but not limited to, name, description, users (along with role-based access control (RBAC) and stakeholder details) and project timeline (start date and end date). All the features including, but not limited to, device templates, device instances, value generation rules, data simulation paths, web services, and test scenarios, are created within the project.

The tester is enabled to create a plurality of device templates and test instances using the plurality of device templates. The tester is then enabled to create a plurality of test scenarios in accordance with the requirements of IoT application 102. The plurality of test scenarios are executed at regular intervals to validate IoT application 102 against the requirements. A test scenario execution report is generated using a dashboard and report generation module 332 comprising test scenarios passing and failing at each sprint. Finally, IoT app health predictor 330 calculates, using an AI model 334, the health of IoT application 102 based on the project end date and a number of test scenarios that have failed, if the project completes on time.

In accordance with an embodiment, AI model 334, based on the execution of test scenarios and their failure rates, predicts the velocity of the project and thus can predict if the project can be completed on time or not. Based on the test scenario executions, emails are sent to the stakeholders with the project health score along with the details of project velocity and possibility of completing (in %) the project as per the deadline defined for the project.

In accordance with another embodiment, AI model 334 is used for predicting resolutions for issues. IDV tool 308 allows a tester/developer to enter possible root causes for test steps which have failed. Based on the previously entered resolutions and similar failures that have happened during the test scenario execution, testing engine 328, post execution of a test scenario, apart from showing the test report, also provides a resolution report with possible root causes and fixes. AI model 334 improves with every execution and creates the best practice report for the project, which can be used when starting a new IoT project.

In accordance with yet another embodiment, AI model 334 is used for regression test groups. AI model 334 continuously monitors the execution of test scenarios and based on the failure in the previous run, suggests to the tester a test group with all the test scenarios which enable the regression testing of the new build.

While performing bug fixes in one feature of IoT application 102, it may be the case that a developer has broken some other functionality of IoT application 102. Based on the patterns related to the issues, AI model 334 suggests addition of extra test scenarios which can be included into a sanity test group for the project.

Although a major utility of IDV tool 308 is to simulate the device instances, and validate behavior of IoT application 102 during its development, IDV tool 308 is also used for validating the live devices which are on field (even after IoT application 102 has gone to production) using a live device testing module 336. One or more device templates may be created based on an OEM's technical specification. The one or more device templates include, but need not be limited to, attributes, properties, message parameters and message structure along with message transmission rules.

Live device instances are created similar to the way simulated device instances are created except for the fact that for live device instances, a live device switch/flag is ON. The live device instances can be created individually (one at a time) through UI module 316 or can be created in bulk through uploading the file. Unlike simulated device instances which are used for validating IoT application 102 behavior, live device instances are primarily created to validate whether the devices installed in field are working as per the OEM's specification.

Test scenarios are specifically created for validation of live device instances, which contains test steps written as per the OEM's specification and mostly just the 'Happy Path'. Test scenarios having live device instances as test data, cannot be executed manually. Live device testing module 336 checks if the device id in the incoming log is of a live device instance, and if it is the case, live device testing module 336 picks the test scenarios which contain the live device instances and performs the validations. It is possible to use multiple test scenarios for validating the live device instances. The validation results of live device instances can be viewed in the 'Test Execution' section of test scenarios.

During live device testing, IoT app validator 326 is further configured to enable playback of IoT messages received from a live device instance using a playback module 338 and send the IoT messages back to IoT application 102. Parameters such as, but not limited to, date range, date and time fields of an IoT message are selected to be updated during playback.

For using the playback feature, a user can select date range (From 'date' and To 'date'), select the date and time fields of the message which needs to be updated and then select the playback features. While executing the playback logic, testing engine 328 pulls all the messages received from the live device instances and sends it back to IoT application 102. While sending the messages to IoT application 102, testing engine 328 updates the date and time parameters in the message with a current date and time. It is possible that more than one live device instance messages are played back. For instance, messages received from all the live device instances within the date range are played back. In case the live device instances from which the messages are received during the date range are created using different device templates, the user is shown all the possible fields (of various device template messages) which are of type date and time, which need to be updated with a current date and time while replaying.

FIG. 4 illustrates a process flow diagram of a method for creating simulated device instances in accordance with an embodiment of the invention.

As illustrated in FIG. 4, at step 402, a user can create the simulated device instances one at a time (single) or in a bulk. If the user opts for a single instance creation, at step 404, the user can either manually create the device instance or create the device instance by importing a definition JSON file.

If the user chooses to manually create the device instance, at step 406, a predefined device template can be selected, and the device instance is created. At step 408, the user can set device instance specific values for attributes such as, but not limited to, model number, and manufacturing date. At step 410, the user can create and save the new device instance and at step 412, can set device instance specific connection details such as, but not limited to, IoT endpoint and protocol broker endpoint.

On the other hand, if the user chooses to create the device instance via JSON file upload, at step 414, the user can select the JSON definition file for the device instance(s) creation.

In an ensuing step 416, the process parses and verifies if the JSON file is valid. If the JSON file is valid without any errors, at step 418, the device instance(s) are created based on the input JSON file. If the JSON file is invalid, at step 420, errors in the JSON file are fixed and the process gets repeated.

At step 402, if the user opts to create the device instances in bulk, the process flow executes steps 414 and 416.

Figure 5:
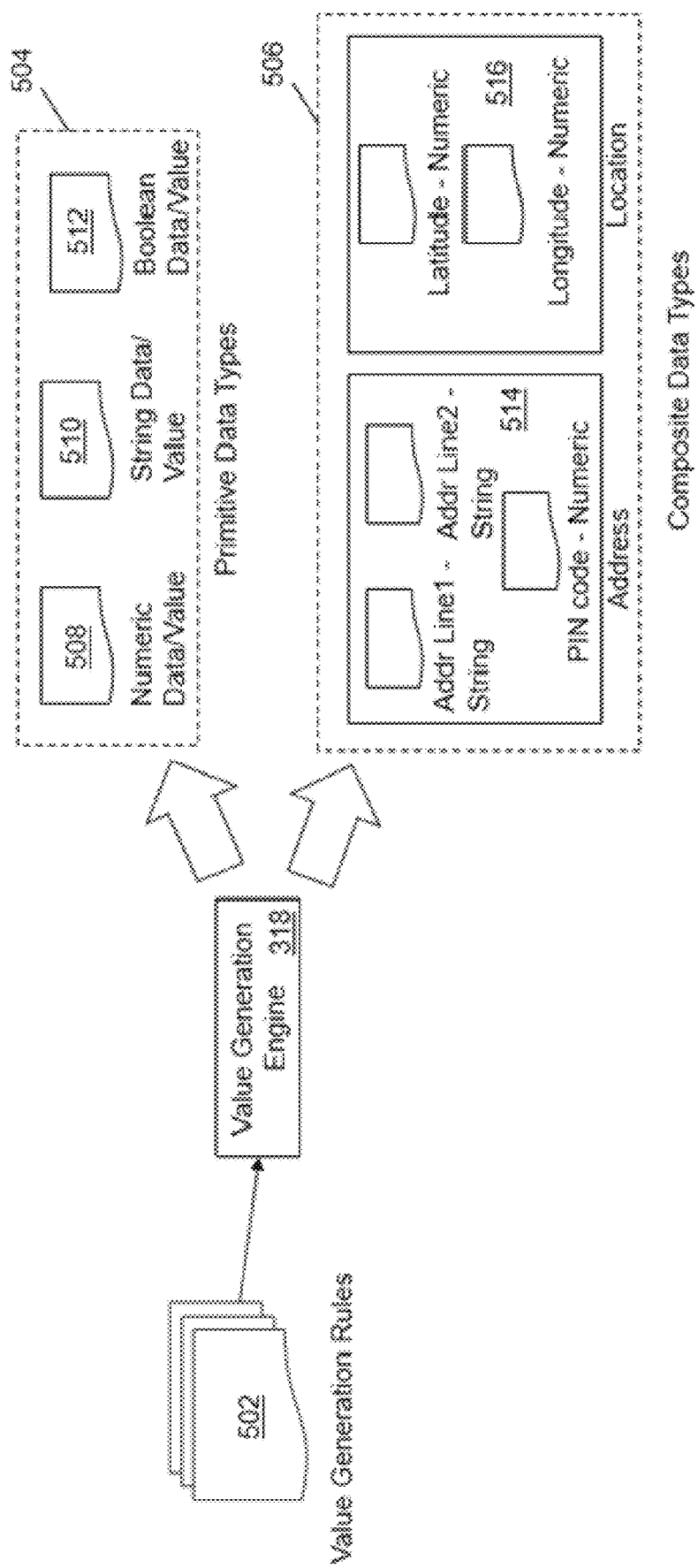
FIG. 5 illustrates functionality of a value generation engine in accordance with an embodiment of the invention.

FIG. 5 illustrates functionality of value generation engine 318 in accordance with an embodiment of the invention.

Value generation engine 318 is the key component of IDV tool 308 and is used for performing three types of simulation based on all the three components using value generation rules 502. The three types of simulation include device behavior simulation, master data simulation and third-party web service simulation.

Referring to FIG. 5, the data to be simulated is divided into two categories namely, primitive data types 504 and composite data types 506.

Every atomic data can be represented in the form of primitive data. IoT data simulator 310 comes with pre-defined screens for defining rules for primitive data types 504. Primitive data types 504 include, but need not be limited to, Numeric data/value 508, String data/value 510 and Boolean data/value 512.

Numeric data 508: Both integers and decimal numbers can be represented in this format. Rules for numeric data type define how the numeric value needs to be generated such as number of digits after the decimal point (can be set to zero to generate integers). The number generation rule can be set as Random, Constant, Increasing or Decreasing. For a Random rule, the user can specify the range between which the numbers need to be randomly generated. In case of Constant rule, the user can provide an array of numbers, from which value generation engine 318 will either randomly or sequentially pick a number. In case of Increasing rule, the user can input a step size such as every iteration the number needs to be incremented by and by what value. Similarly, for Decreasing rule, the user can specify the step size to reduce. For both Increasing and Decreasing rules, a range can be provided for value generation engine 318 to generate the numbers in between.

Every rule also contains a loop flag, which if set, value generation engine 318 will loop back if it reaches the end of the range. For example, if the range is between 0-100 and step size is 2 and the loop is set to TRUE, then for Increasing rule, value generation engine 318 generates the following numbers 0, 2, 4, 6, . . . 98, 100, 0, 2, . . . .

Rules are also set to specify if certain numbers are not required to be generated. For example, if the exclude list is set for 20, 22, 26, 28, value generation engine 318 while generating numeric values, will not generate the numbers from the exclude list. Also, for generating erroneous data, rules can be set to specify the percentage of data to be generated as NULL.

String data/value 510 can be a single character or a word or a statement. Strings can be generated in two forms either by specifying the regular expressions or by specifying the array of predefined characters, words or statements separated by commas such as, for example, a, b, c or John, Steve, Rachel or Sunny Day, Rainy Day. Rules can be specified if a certain set of characters, words, sentences must be excluded during data generation, and based on a percentage of null data to be generated.

Boolean data/value 512 represents a toggle state. Rules for generating Boolean data/value 512 can be done using a predefined set of values such as TRUE-FALSE, ON-OFF, and YES-NO. Also, value generation engine 318 allows the user to define their own set of Boolean values such as, but not limited to, UP-DOWN, and RIGHT-LEFT. The user can also specify a percentage of null data to be generated.

Values for primitive data types 504 can be generated using methods such as, but not limited to, using code logic, by referring data from an external file, and referring data from an external database.

Using code logic is the default option for value generation engine 318. In this option, value generation engine 318 generates the data using predefined logic for generating random numbers, for example. The values used in the examples above are defined using code logic, but these are predefined logic. However, a user can write their own custom data generation logic (in Python language) and upload it as logic to be used for generating primitive data types 504. For example, a logic is written to simulate a value which follows complex parabola mathematical equations.

Instead of the value generation engine 318 simulating the data, a user can also specify to refer the data from an external file. For example, an MEI number of all mobile devices under test can be already available in a CSV file. In this scenario, instead of redefining the logic of defining a new rule, value generation engine 318 is enabled to refer to a particular column of the external file and specify that the value for the field should be picked from a particular column. Two types of file formats for external reference files are supported namely CSV and JSON. In case of a CSV file, the user can specify which column needs to be referred and in case of a JSON file, the user can specify which Key is to be referred.

An external database can also be a reference data source which can be used for populating the primitive data elements (such as external files). It is possible that the master data is already available in a database and it will be easier to simply refer that data instead of generating the values using some random logic. A user can set the database connection settings along with the table and column name details.

Unlike primitive data types 504 which are predefined, IDV tool 308 also provides users with the ability to create, save and reuse some custom value generation rules 502, which are complex and built using primitive data types 504. These are referred to as composite data types 506. For example, a user can create a rule to generate address data type 514 which consists of two address lines, that is, Address Line 1 and Address Line 2 (defined using String rule type) and one PIN code (defined using Numeric rule type). In another example, the user can create a rule to generate location data type 516 which consists of latitude and longitude details (defined using Numeric rule type). Composite data types 506 once created, can be saved and reused later.

Figure 6:
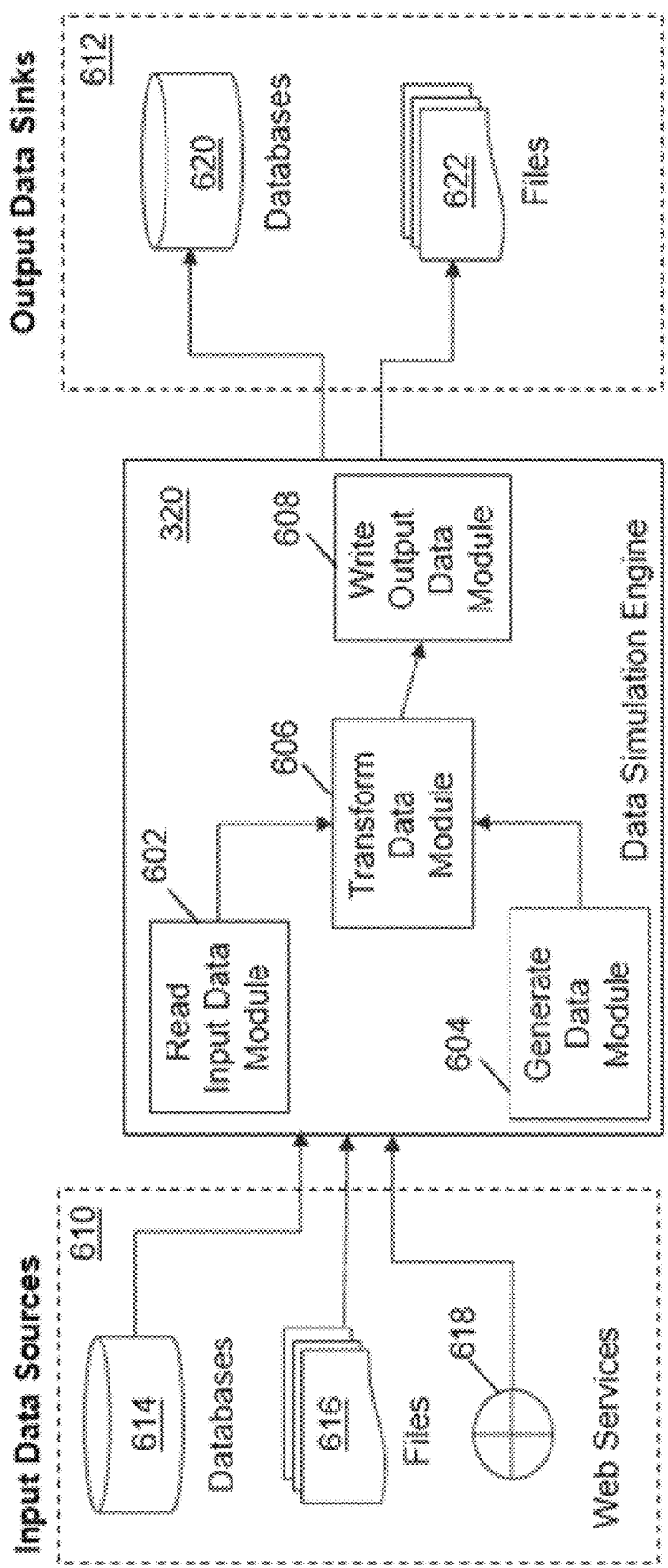
FIG. 6 illustrates functionality of a data simulation engine in accordance with an embodiment of the invention.

FIG. 6 illustrates functionality of data simulation engine 320 in accordance with an embodiment of the invention.

The master data referred by IoT application 102 also needs to be simulated during the development of IoT application 102, as access to clients/production Enterprise Resource Planning (ERP) data may not be possible.

As illustrated in FIG. 6, data simulation engine 320 include the following components: Read Input Data module 602, Generate Data module 604, Transform Data module 606, and Write Output Data module 608.

Read Input Data module 602 obtains the input data from input data sources 610. Using the input data, Generate Data module 604 generates the data and Transform Data module 606 transforms the data and dumps the data at a place where IoT application 102 can refer to. Communication between all the modules inside data simulation engine 320 is JSON. The transformed data is streamed to output data sinks 612 via Write Output Data module 608.

Read Input Data module 602 is configured to read input data from external input data sources 610 such as, but not limited to, Databases 614, Files 616 and Web Services 618.

The following steps enable Read Input Data module 602 to read data from Databases 614.

Read Input Data module 602 is configured with database details such as, but not limited to, server name, port number, username and password. Once the database connection is established, Read Input Data module 602 pulls all the tables and schema details for the user to access.

The user can select tables and columns from the tables which need to be pulled from a source database. The user can also write SQL queries to specific sets of data from tables which need to be fetched (for example, writing an SQL query to pull only machine data whose manufacturing date is greater than Jan. 1, 2018).

The user can also specific the frequency at which the data needs to be read (for every table configured/for every SQL query mentioned) such as, for example, every minute/hour/day/week/month or a specific time of a day/week/month.

The following steps enable Read Input Data module 602 to read data from Files 616.

Read Input Data module 602 is configured with the filesystem location from where the source data files need to be read. The location can be, but need not be limited to, on the current machine, or a cloud endpoint. The data file formats supported can be, but need not be limited to, CSV and JSON. All the files present at the filesystem location are shown to the user. Based on the files selected, UI module 316 displays the file schema to the user to enable them to select the fields which need to be read from the file. For example, if the file format is JSON, UI module 316 shows which keys need to be read, and if the file format is CSV, UI module 316 shows which columns need to be read.

For every field that is selected, the user must mention the data type (such as, but not limited to, Integer, Decimal, String or Boolean) as this data will not be available in data files. This enables applying appropriate data validation rules before fetching the data and while outputting the data.

The user can also specify the frequency at which the data needs to be read (for every table configured/for every SQL query mentioned) such as, for example, every minute/hour/day/week/month or a specific time of a day/week/month.

The following steps enable Read Input Data module 602 to read data from Web Services 618.

To start with, a web service endpoint is configured (URL, Method: GET, POST Headers, Body, Authentication). Out of all the fields coming as part of a JSON response of the API, the user can select fields that are of interest. For every field that is selected, the user can also mention the data type (such as, but not limited to, Integer, Decimal, String or Boolean) as this data will not be available in data files. This enables applying appropriate data validation rules before fetching data and while outputting the data.

The user can also specify the frequency at which the data needs to be read (for every table configured/for every SQL query mentioned) such as, for example, every minute/hour/day/week/month or a specific time of a day/week/month.

In case there is no input source to refer to for the data, Generate Data module 604 generates the test master data using value generation rules 502.

The user can first define a table structure using UI module 316. For each column of the table, the user can then assign value generation rules 502 (such as, but not limited to, String, Boolean, Integer or Decimal). Value generation rules 502 is a reusable module in IDV tool 308 which is used for generating simulated data which can be then be assigned to various parameters such as, but not limited to, message parameter for devices, attribute values, and data generation. The user can also define the frequency at which the value generation rules 502 are to be executed and the new row that is to be created in the defined table.

Using Transform Data module 606, the data which is either read from an external source or generated using rules is transformed before it is streamed to output data sinks 612. Transformation is required for various reasons such as when the data which is read from an external source is a real data which may not be used as is such as a customer name or address, and therefore morphing/masking of the data is required, or the data which is read from a source may be required to be transformed to represent a completely different data for testing purposes. For example, if the latitude and longitude values are currently of India in the input data source, but for representing a different geographic location, transformation rules may need to be defined so that before the data is pushed out, the location data is converted into USA latitude and longitude values and so on. Transformation rules are also written to deliberately introduce errors in the data for testing purposes.

For all the columns in the database table which need to be transformed/morphed/masked, a separate transformation rule may be written for each of such columns. Transformation rules are primarily written using a regular expression (for example, by finding a pattern and replacing it with a new dataset). There can also be scenarios where no transformation of data is required. The transformed data is then pushed into external output data sinks 612.

Output data sinks 612 generally include the master data which IoT application 102 refers to for its business logic. Based on the requirement of IoT application 102, output data sinks 612 can be, but need not be limited to, Databases 620 and Files 622.

Databases 620 can either be a relational database or a no-SQL database to which Write Output Data module 608 supports pushing of data.

In case of relational databases, the user can configure database details such as, but not limited to, server name, port, username and password for database connections. UI module 316 of IDV tool 308 provides the user with an interface to define table schema. The user is also provided the option to create the table if it does not exist, which in this case, is all the incoming data from Transform Data module 606. In case the table schema is defined by the user, IDV tool 308 also provides the functionality to create the mapping between transformed data fields and the output table columns.

In case of no-SQL databases, the user can configure the no-SQL database connection details. The JSON files coming from Transform Data module 606 are directly dumped into the no-SQL database.

For Files 622, the filesystem location is configured. There are two scenarios where IoT application 102 reads the data from Files 622. Some part of master data is stored in Files 622. For instance, IoT applications which are developed to read data from other systems, or which do not directly connect with sensors, generally fetch the IoT sensor data from a filesystem location at which the legacy systems store the files. For testing such IoT applications, this functionality is highly useful. IDV tool 308 supports the capability to dump the output in the following two file formats: CSV and JSON. The user can configure the filesystem location to which the target data files need to be saved. This location can be on the current machine, or a cloud endpoint.

Each of the flows, from Input Data/Generate Data ⇔ Transform Data ⇔ Output Data is saved as a separate data simulation path. Individual data simulation paths can have multiple input data sources and multiple output data sinks. A user can create a data simulation path, by giving it a unique name, selecting the input data sources, setting transformation logic and specifying the output data sinks. A new data simulation path can be created by inheriting it from previously created data simulation paths to speed up the process of creating new data simulation paths with minor differences from a previous definition. All the data simulation paths are stored and viewed as a list in 'Data' section of IDV tool 308. Furthermore, the already created data simulation paths can be modified/deleted.

Figure 8:
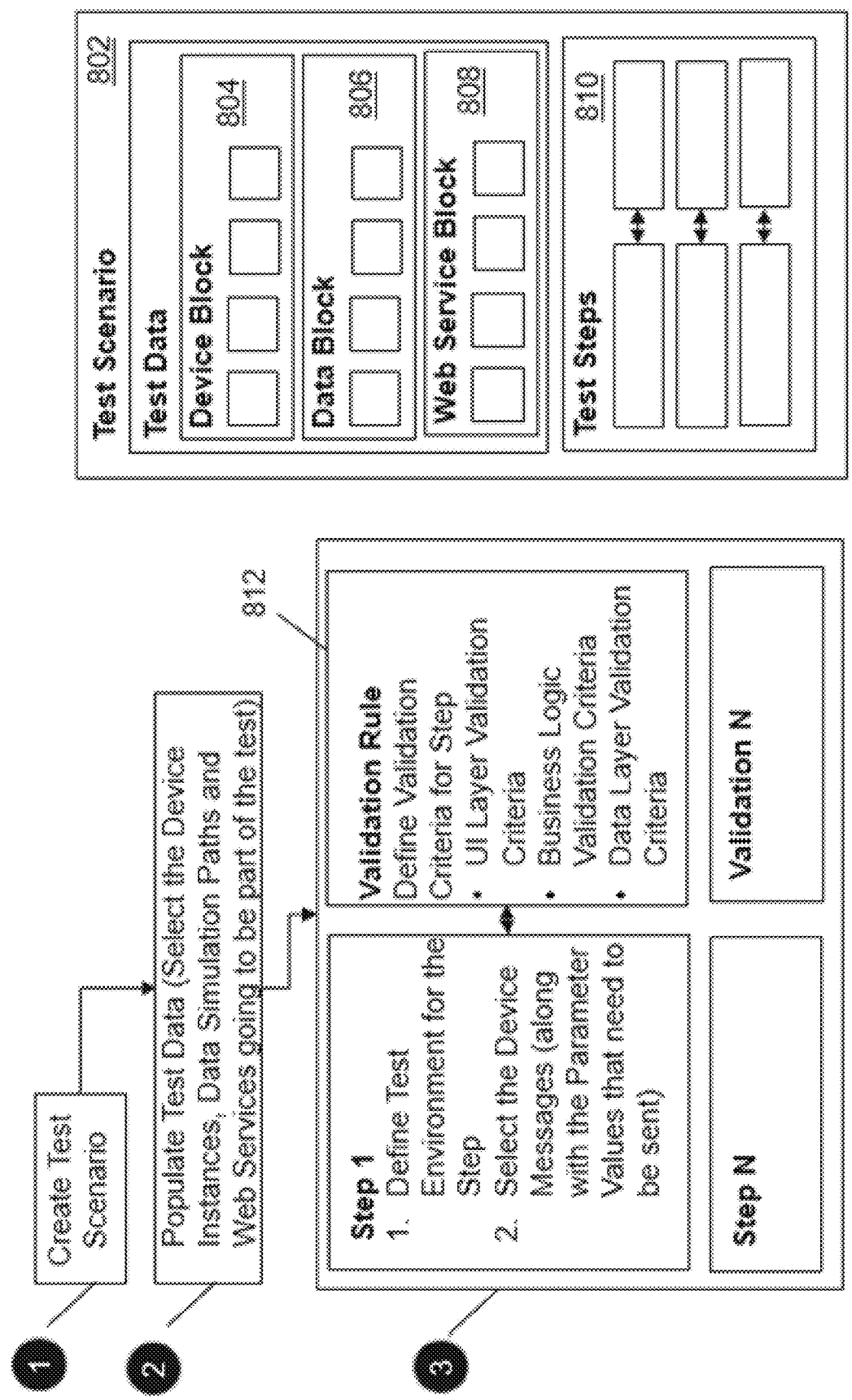
FIG. 8 illustrates a process for creating a test scenario in accordance with an embodiment of the invention.

FIG. 8 illustrates a process for creating a test scenario in accordance with an embodiment of the invention.

As illustrated in FIG. 8, at step (1), a test scenario 802 is created. At step (2), test scenario 802 is populated with respective blocks which are required for carrying out the test. These blocks include device block 804, data block 806 and web service block 808.

Each block is populated with the entities, which will participate in the testing such as, but not limited to, device instances to be used in device block 804, data simulation paths to be used in data block 806 and a list of web services to be used in web service block 808.

At step (3), test steps 810 are created within a test scenario. Each test step will first simulate the required environment around IoT application 102 such as placing an asset in a particular state by setting a particular value for the last service date, setting its current health state to a particular value, and its location to a particular geography and so on.

A device message is selected along with the parameter values which need to be sent along with the device message. Erroneous values can also be set. For example, a health message of IoT application 102 is sent with an engine temperature value as 50 above the threshold. There can be a possibility that in each step, after setting the initial environment, multiple device messages may be configured to be sent, in which case a tester can also specify if there needs to be a time gap between sending two subsequent messages. While selecting the device message, the tester uses the device template and not the actual device instance, so that while executing the test scenario, the same test step can be used for sending messages for various device instances (belonging to the same device template) and thus enabling the load testing.

For each step, the tester can also specify validation criteria 812 to check if IoT application 102 is working as per the requirements. For example, if IoT application 102 under test is monitoring a fleet of trucks and the requirement is that if the last maintenance date of a truck is more than 3 months old and a current engine temperature is above threshold of a 20 degrees, a service ticket must be automatically created, and an alert must be sent to the stakeholders.

Once all the test steps for a test scenario are written, the tester can now simply run the test scenario to test a particular requirement. One test scenario may be used for testing one requirement of IoT application 102.

Load testing and performance testing can be done by adding a greater number of device instances in step (2), where the test data is created. Testing engine 328 automatically creates threads in the background where each thread simulates one device instance.

In a test step, it may be possible to use device instances belonging to different device templates. For example, considering the truck use case, one device template is for the engine of the truck and another device template is for the radiator. In the test data creation steps, consider that the user has selected two device instances of the engine (device instance ids: Engine1 and Engine2) and two device instances of the radiator (device instance ids: Radiator1 and Radiator2). Before executing the test scenario, the tester needs to create a combination such as Engine1 and Radiator1 as one combination, and Engine2 and Radiator2 as another combination. Testing engine 328 at the backend also creates two threads, a first thread simulating the combination Engine1-Radiator1 and a second thread for the combination Engine2-Radiator2. If the user fails to specify the combination before executing a test scenario, then at the backend, testing engine 328 creates a number of threads equal to all permutations, first thread for simulating Engine1-Radiator1 combination, second thread for simulating Engine1-Radiator2 combination, a third thread for simulating Engine2-Radiator1 combination and a fourth thread for simulating Engine2-Radiator2 combination.

A user can select the test scenarios from the list and then execute them by pressing the 'Start' button and the test scenarios are executed one after another.

For performing load testing or performance testing, a tester needs to add a large number of device instances in the data setup process, and testing engine 328 in the backend creates threads accordingly to simulate the load.

Validation of UI layer 112 happens during the step execution. However, validation of business logic 114 happens at the end of scenario execution.

If any step fails in the scenario execution, the entire test scenario is considered to have failed. The test scenario results can be viewed during/after the test scenario execution. The test scenario execution displays the failed steps along with the root causes of the failure.

Testing engine 328 also allows a developer/tester to enter possible root causes for the failed test step, which can be used later for building intelligence. The testing scenarios can be executed as a single iteration run, or a custom iteration run. For instance, if the user selects a custom iteration run and specifies the iteration count as 10, the same test scenario will be executed 10 times, one after another, and if the scenario consists of multiple device instances for load testing, then all the threads will execute the test scenario for the specified number of iterations. Validation of business logic 114 is done asynchronously after each iteration run.

A tester can further create test groups and bundle test scenarios. The test groups can be used for creation of sanity test scenarios and/or regression test scenarios. Sanity test scenario groups can be executed to validate the overall sanity of an entire application after every new release and contains test scenarios to validate every major functionality of the application. A regression test scenario group contains test scenarios which can be limited to validate if the application has fixed the major bugs in the previous release.

Also, historical test scenario executions can be viewed. To view the historical test scenario execution results, a user can specify the date range (From 'date' and To 'date') and can fetch the execution results from the backend.

Every test step specifies validation rules or criteria 812 which need to be verified to confirm that a specific test step is passed or not. For each test step, validation of IoT application 102 can happen at three levels.

UI layer 112 is one of the modes for providing output of IoT application 102. For example, if a particular threshold is breached, a notification (either a blinking button or an alarm/bell) is displayed on the UI or a KPI value needs to be updated on the UI. Verification of IoT application 102's UI layer 112 may be performed by using third-party automation testing scripts such as, for example, Selenium.

The user can specify the automation test script references that need to be used for a test step and testing engine 328 integrates with an UI automation test tool during execution for performing the UI verification and records the results.

Business logic 114 of IoT application 102 is verified by analyzing the logs of IoT application 102.

Testing engine 328 uses ELASTICSEARCH and Logstash combination for collecting and analyzing the application logs. The testing tool provides a Software Development Kit (SDK) (available in different coding languages, C, C++, PYTHON, JAVA and .Net), which the development team embeds in their code for logging the application flow.

Each log needs to mandatorily capture the device instance id and the application id. Different application ids can be given to the same application based on the environment it is executing. For example, AppID=1001 is for a truck application running in a development environment, AppID=1002 is for the same truck application running in a staging environment and AppID=1003 is for the same truck application running in a production environment.

It is critical for developers and testers to be in sync as per "log text" considered, since the validation is done on the same. However, an exact matching of the log text, word by word, may not yield the right results as developers may write slightly different logs than initially agreed upon. For example, if the initially agreed upon text is "Email is sent to stakeholders" when a threshold breach is detected, but the developer instead has written "Email is triggered to stakeholders", an efficient way to perform the matching is by looking for keywords (keywords can be "Email" and "stakeholders"). Keywords may be marked in log text by surrounding them between special characters such as '%%'. In this case, the log text can be written as "% Email % is triggered to % stakeholders %".

Apart from the business logic 114 of IoT application 102, IoT app validator 326 verifies the structure and parameter of the incoming IoT messages for validating the live device instances.

It may also be required that IoT application 102 needs to update an ERP database with specific values based on the current state of incoming IoT messages. The validation and updates of data layer 116 can be done by accessing the database. A tester can specify the database table and column to be verified for the change.

Data verification is easier when the database simulation is also done through testing engine 328. However, in case the database updated by IoT application 308 is a production database or a customer database and if access to these databases is not provided, then the best way to verify this is by verifying the business logic logs, which indicates that the database update queries are fried. This is done either directly on the database or by using a web service call. The verification rules are created accordingly.

Figure 9:
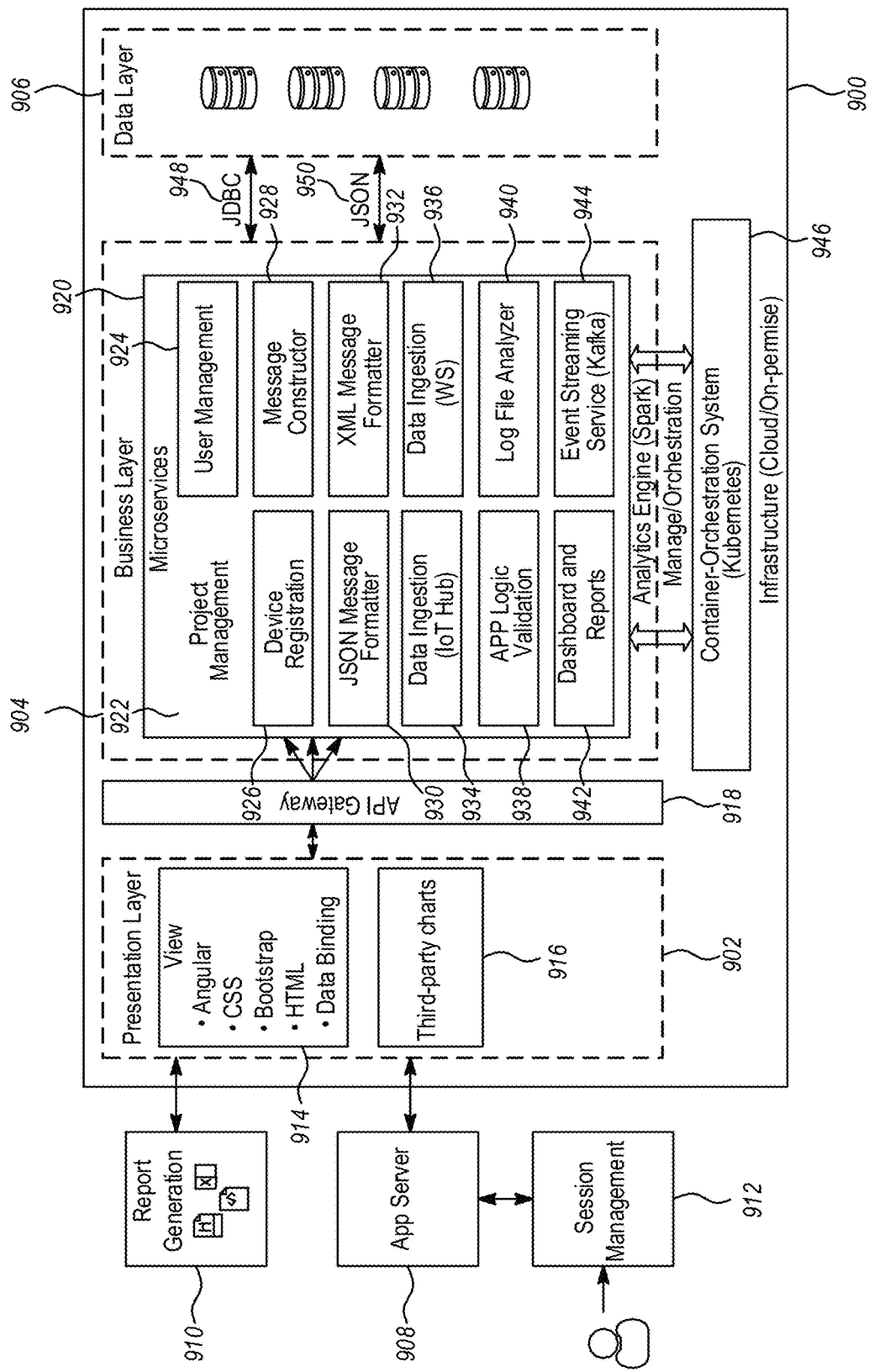
FIG. 9 illustrates a platform design of IoT data validation (IDV) tool using a microservice-based architecture in accordance with an exemplary embodiment of the invention.

FIG. 9 illustrates a platform design of IDV tool 308 using a microservice-based architecture 900 in accordance with an exemplary embodiment of the invention.

As illustrated in FIG. 9, microservice-based architecture 900 is situated in the cloud or on-premise and is logically broken down into three blocks: a Presentation Layer 902, a Business Layer 904, and a Data Layer 906.

Presentation layer 902 provides front-end screens and controls for a user to perform functions such as, but not limited to, the following: login, create projects, define and manage device templates and instances, and create and execute test scenarios. Presentation layer 902 communicates with an app server 908 and a component for report generation 910. A user is authenticated to app server 908 via a session management 912. Presentation layer 902 employs technologies 914 such as, but not limited to, ANGULAR, Cascading Style Sheets (CS S), BOOTSTRAP, Hypertext Markup Language (HTML) and data binding technologies. These technologies help in the generation of third-party charts 916 in collaboration with app server 908 and report generation 910. In an embodiment, the frontend of IDV tool 308 platform is developed as a portal using the ANGULAR and BOOTSTRAP frameworks. Furthermore, a local storage functionality is implemented for caching purposes.

Presentation layer 902 communicates with business layer 904 via an API gateway 918. Business layer 904 is designed based on a microservice architecture, enabling modular design and great flexibility in choosing technologies. The microservice architecture supports microservices 920 which include, but need not be limited to, project management 922, user management 924, device registration 926, message constructor 928, JSON message formatter 930, XML message formatter 932, data ingestion (IoT hub) 934, data ingestion (WS) 936, app logic validation 938, log file analyzer 940, dashboard and reports 942 and event streaming service (KAFKA) 944. In an embodiment, business layer 904 employs JAVA. The entire backend of the IDV tool 308 platform is developed based on microservice design guidelines. Further, business layer 904 is coupled to a container-orchestration system (KUBERNETES) 946 to manage orchestration of microservices 920 in the microservice architecture.

Business layer 904 communicates with data layer 906 using APIs such as, but not limited to, JAVA Database Connectivity (JDBC) 948 and JSON 950. Data layer 906 comprises device metadata and device timeseries data. In an embodiment, data layer 906 employs POSTGRES (PostgreSQL) and TIMESCALEDB technologies. Data layer 906 also comprises a storage layer which employs POSTGRES and TIMESCALEDB technologies. POSTGRES database is used for storing relational data such as, but not limited to, project details, template and instance details, scenario details, and rules. TIMESCALEDB is used for storing timeseries data such as, but not limited to, IoT messages. TIMESCALEDB is optimized for storing and retrieving time-critical data.

Figure 10:
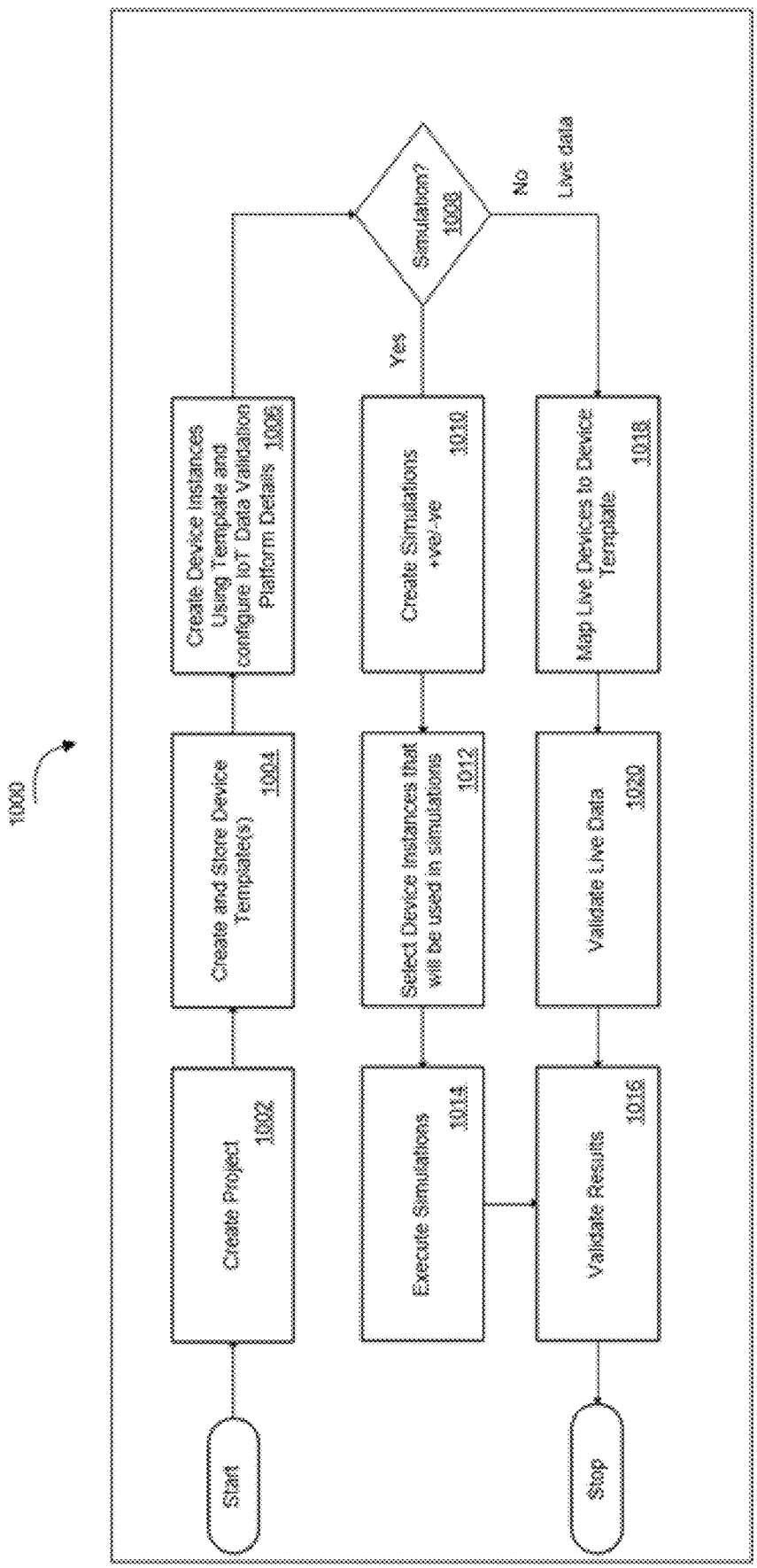
FIG. 10 illustrates a process flow followed by a tester to validate an IoT application using the IDV tool in accordance with an embodiment of the invention.

FIG. 10 illustrates a process flow 1000 followed by a tester to validate IoT application 102 using IDV tool 308 in accordance with an embodiment of the invention.

As illustrated in FIG. 10, at 1002, the tester creates a project in IDV tool 308 which will contain all the required test data such as, but not limited to, device templates, device instances, data rules, connectivity configurations and test scenarios, for testing IoT application 102.

At 1004, the tester then defines and stores device templates such as, but not limited to, attributes, messages and relation between messages, which will represent various devices TYPES to be used in the project as blueprint. A device template screen is illustrated in FIG. 11.

The tester also creates devices instances using the template and configures them with the connectivity details provided by IDV tool 308 at 1006. In accordance with an embodiment, device onboarding is enabled on IDV tool 308. Bases on the requirements, IDV tool 308 is utilized for simulation of devices to test using virtual devices or validating the data coming from live devices.

In accordance with an embodiment, at 1008, if IDV tool 308 is utilized for simulation of virtual devices, the following steps may be followed.

Figure 12:
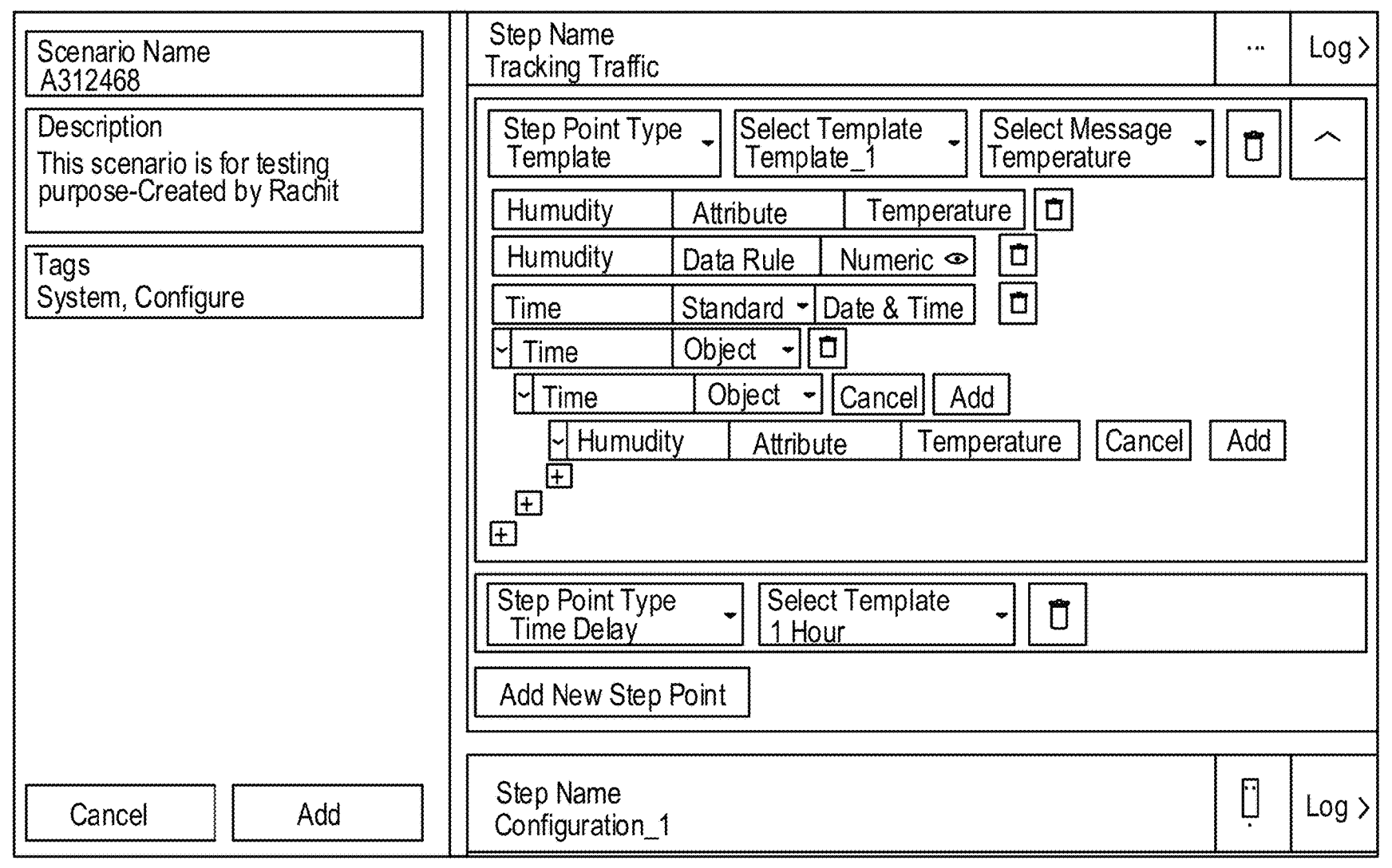

At 1010, the tester creates simulations by defining various test scenarios for testing IoT application 102 by also specifying the expected output from IoT application 102. At 1012, device instances that need to be utilized for simulation testing are then selected. A simulation run is then executed at 1014. Post simulation run, at 1016, IoT application 102 is validated to check if it has executed as per the test scenario. A message definition screen is illustrated in FIG. 12 and a scenario definition screen is illustrated in FIG. 13.

In accordance with another embodiment, at 1008, if IDV tool 308 needs to be utilized for validating messages coming from live devices, at 1018, the live devices are mapped to a defined device template to validate the message formats and message relationships. Firstly, the messages are received from live devices. At 1020, the live messages are validated against the messages and message relationships defined for corresponding device templates and the results are validated at 1016.

Test scenarios are specifically created for validation of live device instances, which contains test steps written as per the OEM's specification and mostly just the 'Happy Path'. Test scenarios having live device instances as test data, cannot be executed manually. Live device testing module 336 checks if the device id in the incoming log is of a live device instance, and if it is the case, live device testing module 336 picks the test scenarios which contain the live device instances and performs the validations. It is possible to use multiple test scenarios for validating the live device instances. The validation results of live device instances can be viewed in the 'Test Execution' section of test scenarios.

Figure 14:
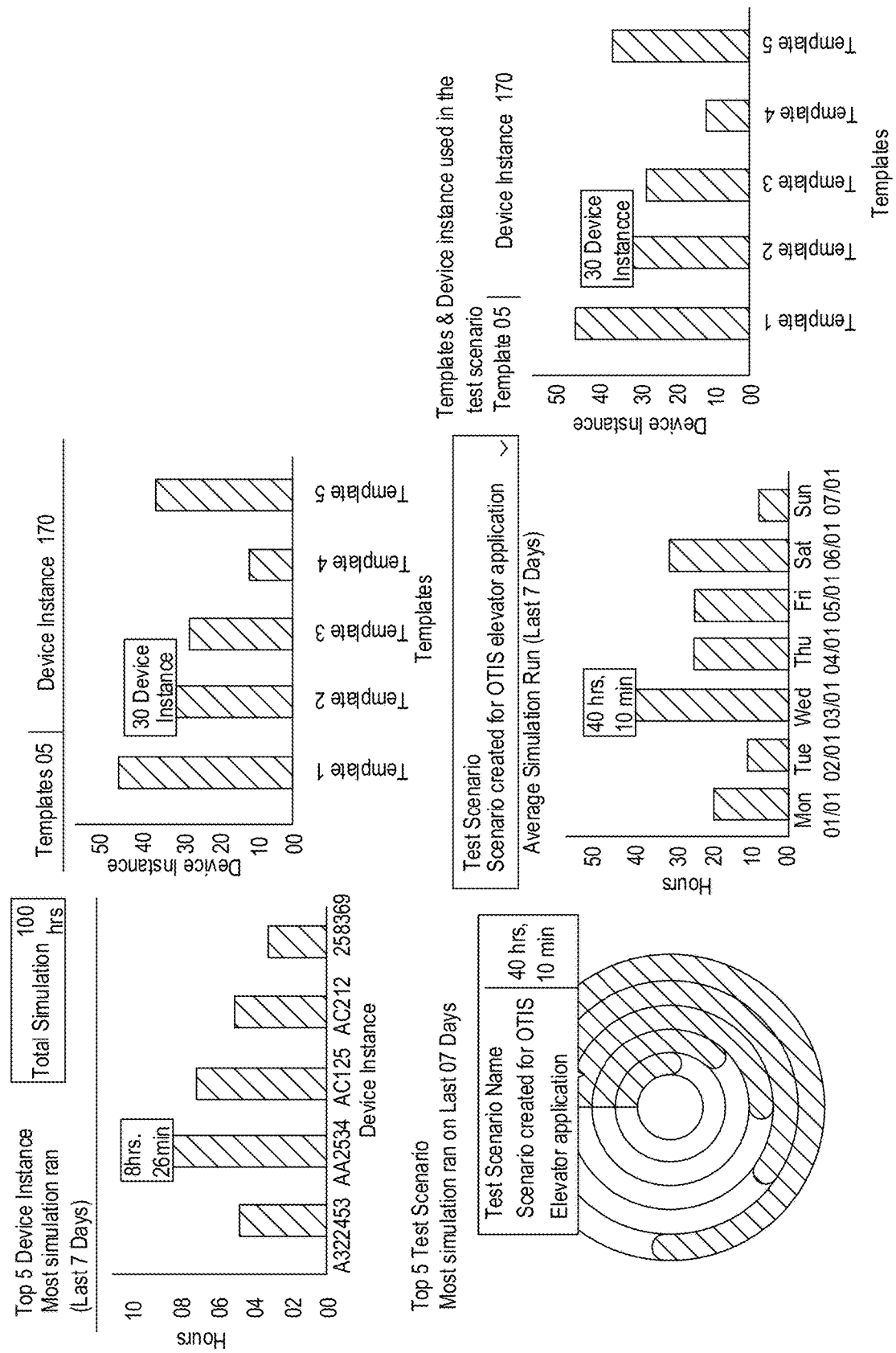
FIG. 14 illustrates a project dashboard screen in accordance with an embodiment of the invention.

Additionally, a test scenario execution report comprising test scenarios passing and failing at each sprint may be generated for the project. A project dashboard screen is illustrated in FIG. 14.

Figure 15:
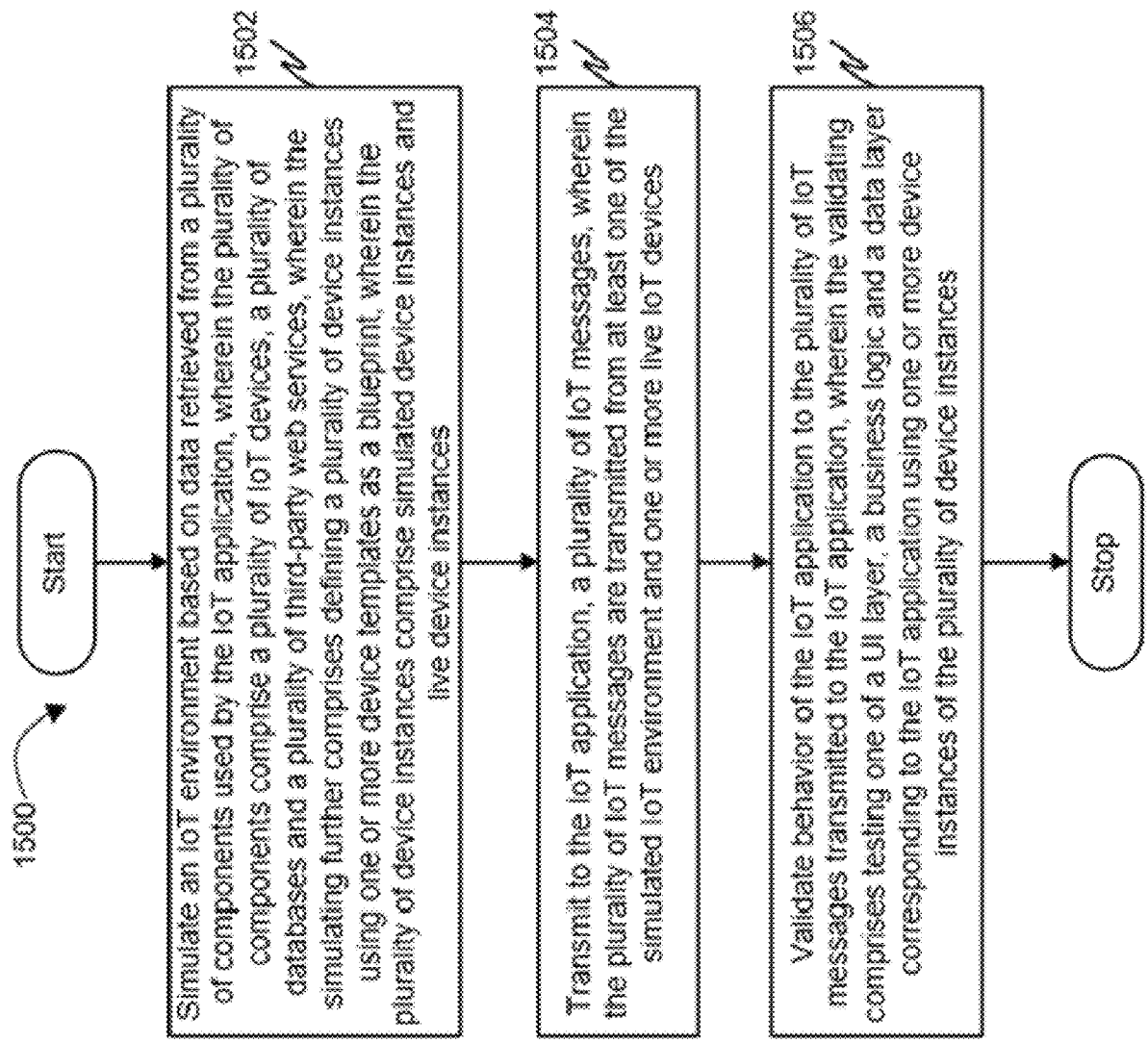
FIG. 15 illustrates a flowchart of a method for performing end-to-end simulation and testing of an IoT application in accordance with an embodiment of the invention.

FIG. 15 illustrates a flowchart of a method 1500 for performing end-to-end simulation and testing of IoT application 102 in accordance with an embodiment of the invention.

As illustrated in FIG. 15, at step 1502, IoT data simulator 310 simulates an IoT environment based on data retrieved from a plurality of components used by IoT application 102. These include IoT messages/data from IoT devices, master data from different databases and data from third-party web services. Connection management module 312 enables IoT data simulator 310 to communicate with the different components or systems to simulate the IoT environment. A user is also enabled to create device templates that are used as blueprint for defining a plurality of device instances using device template and device instances creation module 314. These device instances include, but need not be limited to, simulated device instances and live device instances. The process of simulation is further described in detail in conjunction with FIG. 16.

At step 1504, IoT app validator 326 performs testing and validation of IoT application 102 by transmitting a plurality of IoT messages to IoT application 102. This step is further described in detail in conjunction with FIG. 17, FIG. 18 and FIG. 19.

At step 1506, IoT app validator 326 validates the behavior of IoT application 102 to the plurality of IoT messages using one or more device instances. The plurality of IoT messages may be simulated IoT messages coming from the simulated IoT environment or may be live messages transmitted from live devices/sensors. The plurality of IoT messages are transmitted in various formats such as, but not limited to, JSON format, a CSV format and a ProtoBuf format. IoT app validator 326 validates IoT application 102 behavior from start to end, for all layers including, but not limited to, UI layer 112, business logic 114 and data layer 116.

In accordance with an embodiment, device instances are defined based on IoT device attributes and properties, message structure and a plurality of rules. The plurality of rules can be, but need not be limited to, value generation rules 502 and message transmission rules.

Value generation rules 502 are set for attributes, properties or message parameters. Value generation rules 502 define how values for primitive data types 504 such as String data/value 510, Boolean data/value 512 or Numeric data/value 508 are to be generated. Further, primitive data types 504 enable defining composite data types 506.

The message transmission rules are set to define the conditions for IoT messages that are generated, published and transmitted from IDV tool 308. The message transmission rules create an interlinking between the IoT messages, which triggers a definite sequence of transmitting of one or more IoT messages based on the transmitting of one or more preceding IoT messages. The trigger happens based on detecting existence of any condition in the one or more preceding IoT messages.

Figure 16:
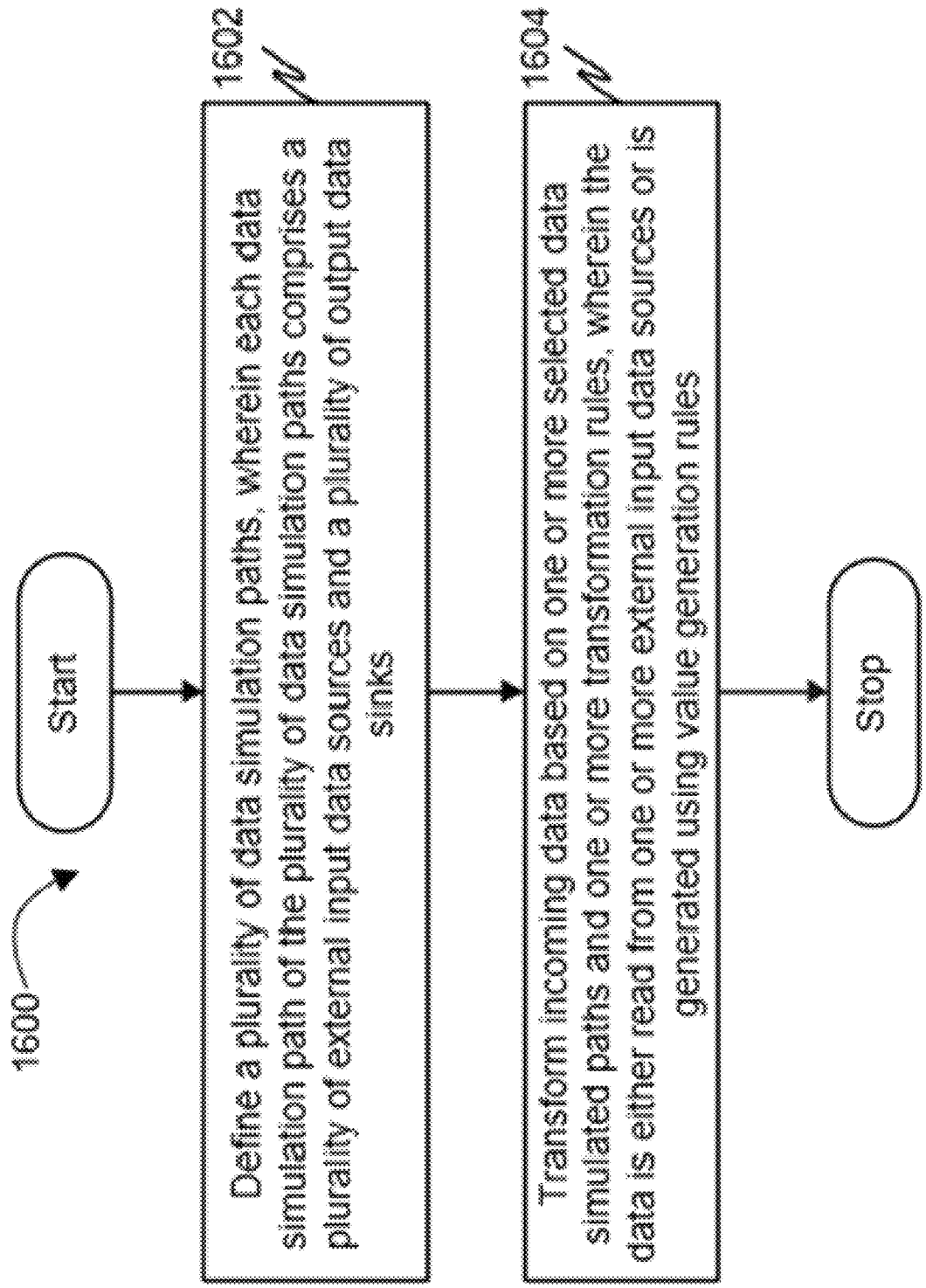
FIG. 16 illustrates a flowchart of a method for performing simulation using a data simulation engine in accordance with an embodiment of the invention.

FIG. 16 illustrates a flowchart of a method 1600 for performing simulation using data simulation engine 320 in accordance with an embodiment of the invention.

As illustrated in FIG. 16, at step 1602, data simulation engine 320 enables defining multiple data simulation paths. The data simulation paths include external input data sources 610 and output data sinks 612. At step 1604, data simulation engine 320 transforms incoming data based on one or more selected data simulation paths and one or more transformation rules. This data is either read from one or more external input data sources 610 or may be generated using value generation rules 502.

Figure 17:
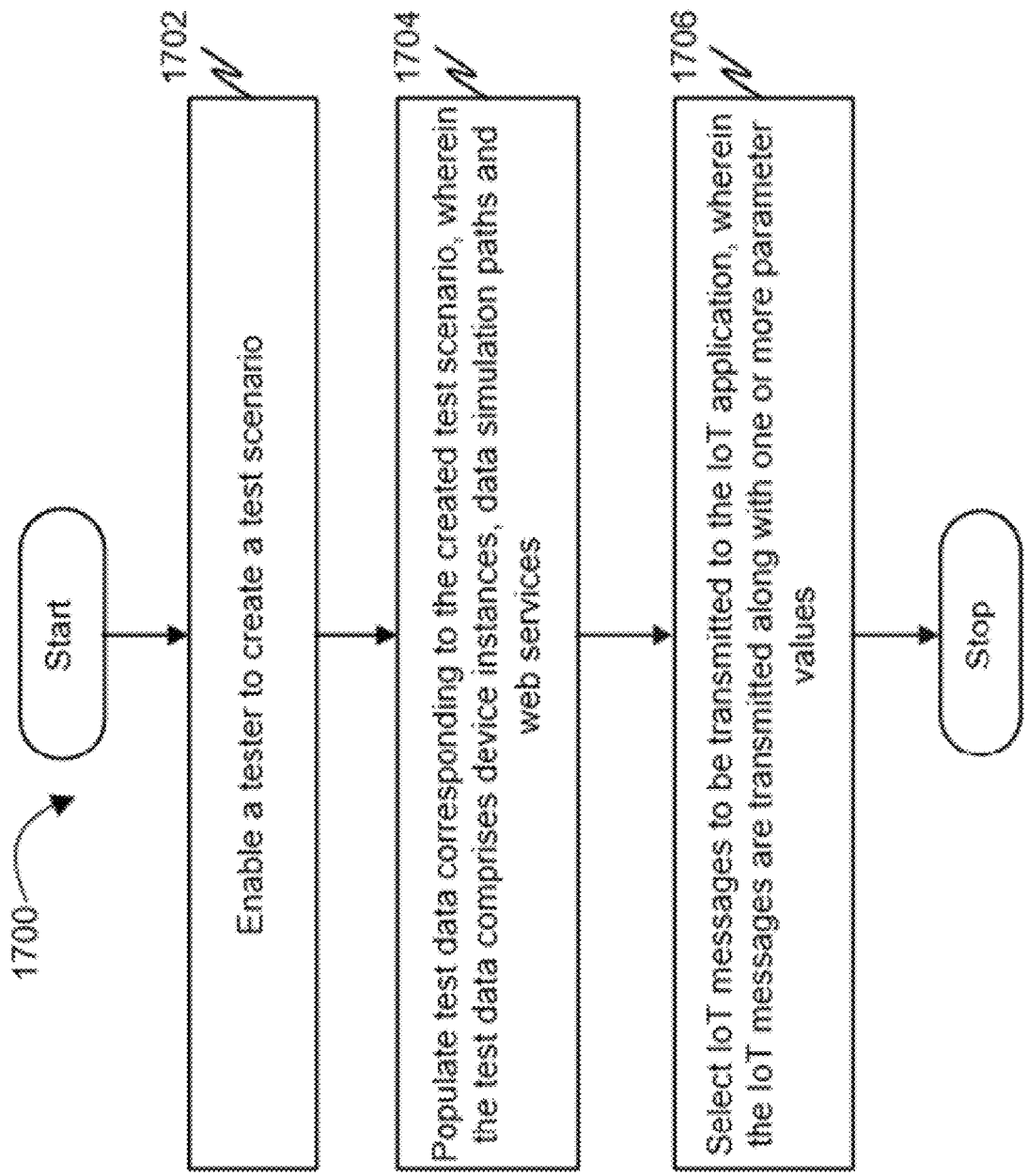
FIG. 17 illustrates a flowchart of a method for creating a test scenario for testing an IoT application in accordance with an embodiment of the invention.

FIG. 17 illustrates a flowchart of a method 1700 for creating a test scenario for testing IoT application 102 using testing engine 328 in accordance with an embodiment of the invention.

As illustrated in FIG. 17, at step 1702, testing engine 328 enables a tester to create test scenarios. At step 1704, testing engine 328 populates test data corresponding to the created test scenario. The test data include, but need not be limited to, device instances, data simulation paths and web services. Finally, at step 1706, testing engine 328 selects IoT messages to be transmitted to IoT application 102 along with one or more parameter values and validates IoT application 102 using the test data.

Figure 18:
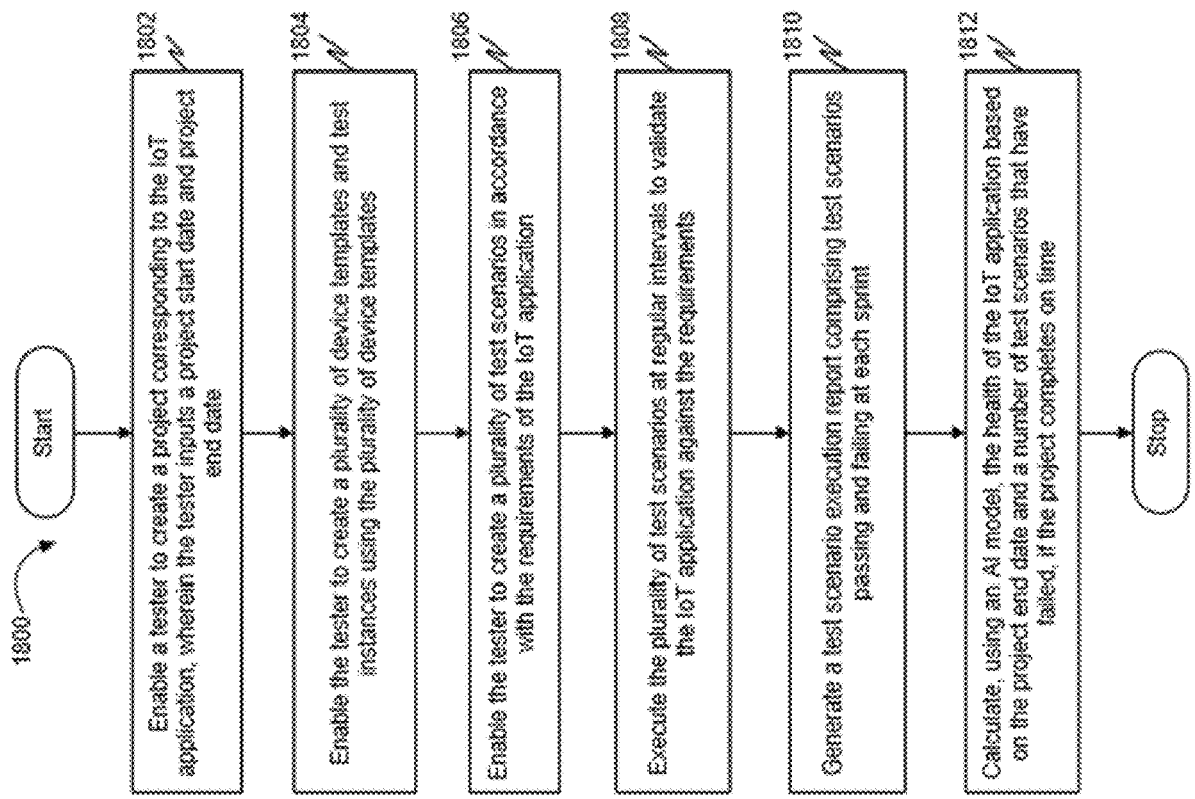
FIG. 18 illustrates a flowchart of a method for predicting health of an IoT application in accordance with an embodiment of the invention.

FIG. 18 illustrates a flowchart of a method 1800 for predicting health of IoT application 102 using IoT app health predictor 330 in accordance with an embodiment of the invention.

As illustrated in FIG. 18, at step 1802, a tester is enabled to create a project corresponding to IoT application 102. The tester inputs a project start date and project end date.

At step 1804, the tester is enabled to create a plurality of device templates and test instances using the plurality of device templates. At step 1806, the tester is then enabled to create a plurality of test scenarios in accordance with the requirements of IoT application 102.

At step 1808, the plurality of test scenarios are executed at regular intervals to validate IoT application 102 against the requirements. At step 1810, a test scenario execution report is generated which includes test scenarios passing and failing at each sprint.

Finally, at step 1812, IoT app health predictor 330 calculates, using AI model 334, the health of IoT application 102 based on the project end date and a number of test scenarios that have failed, if the project completes on time. In an embodiment, AI model 334, based on the execution of test scenarios and their failure rates, predicts the velocity of the project and thus can predict if the project can be completed on time or not. In another embodiment, AI model 334 predicts resolutions for issues and possible root causes for the test steps which have failed, based on the previously entered resolutions and the similar failures happening during the test scenario execution. In yet another embodiment, AI model 334 monitors the execution of test scenarios and based on the failure in the previous run, suggests to the tester a test group with all the test scenarios which enable regression testing of a new build.

Figure 19:
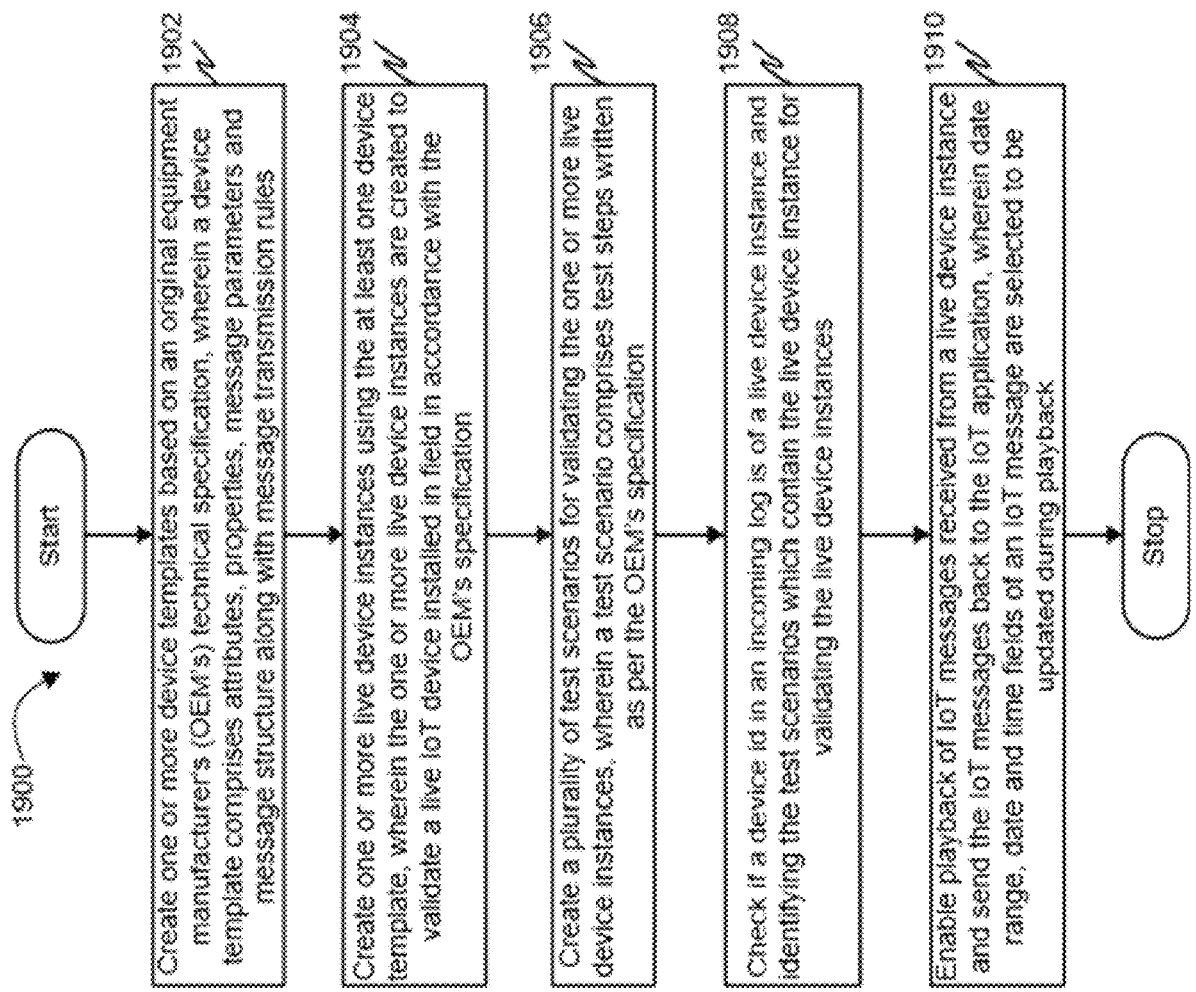
FIG. 19 illustrates a flowchart of a method for validating a live IoT device in accordance with an embodiment of the invention.

FIG. 19 illustrates a flowchart of a method 1900 for validating a live IoT device in accordance with an embodiment of the invention.

As illustrated in FIG. 19, at step 1902, one or more device templates are created based on an OEM's technical specification. The one or more device templates include, but need not be limited to, attributes, properties, message parameters and a message structure along with message transmission rules.

At step 1904, one or more live device instances are then created using the device templates. These live device instances are created to validate a live IoT device installed in field in accordance with the OEM's specification.

In an ensuing step 1906, a plurality of test scenarios for validating the one or more live device instances are created, which include test steps written as per the OEM's specification.

At step 1908, live device testing module 336 checks if a device id in an incoming log is of a live device instance and identifies the test scenarios which contain the live device instance for validating the live device instances.

Finally, at step 1910, live device testing module 336 enables playback of IoT messages received from a live device instance and sends the IoT messages back to IoT application 102 using playback module 338. Parameters such as, but not limited to, date range, date and time fields of an IoT message are selected to be updated during playback.

The present invention is advantageous in that it provides the capability to perform end-to-end simulation and testing of IoT applications by validating the behavior of the IoT application from start to end at all three layers, UI layer, business logic and data layer.

The invention enables a tester to define IoT application behavior when a specific message is sent from a live device or a simulator. Further, the present invention provides the ability to validate the live devices and/or simulated messages as per vendor provided specification, message format/structure, and validation rules/criteria defined for the messages. Also, the present invention provides the ability to record and playback messages received from live devices during live device testing.

Furthermore, the IDV tool of the present invention provides different features, which enables a tester to create appropriate datasets and test scenarios, to create, execute and validate an IoT application. The IDV tool performs testing, validation, and verification of an application architecture, and integration between all the IoT components for different business use cases and requirements. The IDV tool identifies bugs at the integration level and performance issues at the component level and using AI suggests resolutions to fix these issues. Load testing, performance testing and solution testing are performed by the IDV tool considering the requirements of an end-user or a customer and real-time use cases.

Those skilled in the art will realize that the above recognized advantages and other advantages described herein are merely exemplary and are not meant to be a complete rendering of all of the advantages of the various embodiments of the present invention.

The system, as described in the invention or any of its components may be embodied in the form of a computing device. The computing device can be, for example, but not limited to, a general-purpose computer, a programmed microprocessor, a micro-controller, a peripheral integrated circuit element, and other devices or arrangements of devices, which are capable of implementing the steps that constitute the method of the invention. The computing device includes a processor, a memory, a nonvolatile data storage, a display, and a user interface.

In the foregoing specification, specific embodiments of the present invention have been described. However, one of ordinary skill in the art appreciates that various modifications and changes can be made without departing from the scope of the present invention. Accordingly, the specification and figures are to be regarded in an illustrative rather than a restrictive sense, and all such modifications are intended to be included within the scope of the present invention.

We claim:

1. A system for performing end-to-end simulation and testing of an IoT application, the system comprising a processor configured to implement:
an IoT data simulator, the IoT data simulator simulating an IoT environment based on data retrieved from a plurality of components used by the IoT application, wherein the plurality of components comprise a plurality of IoT devices, a plurality of databases, and a plurality of third-party web services, wherein the IoT data simulator defines a plurality of device instances using at least one device template as a blueprint, wherein the plurality of device instances comprise simulated device instances and live IoT device instances;
an IoT application validator to transmit, to the IoT application, a plurality of IoT messages, the plurality of IoT messages transmitted from the IoT environment and at least one live IoT device;
wherein the IoT application validator:
validates behavior of the IoT application in response to the plurality of IoT messages transmitted to the IoT application;
tests one of a UI layer, a business logic, or a data layer corresponding to the IoT application using at least one device instance of the plurality of device instances;
predicts a health of the IoT application;
enables a tester to create a project corresponding to the IoT application including a project start date and project end date;
enables the tester to create a plurality of device templates and to create test instances using the plurality of device templates;
enables the tester to create a plurality of test scenarios in accordance with requirements of the IoT application;
executes the plurality of test scenarios at regular intervals to validate the IoT application against the requirements of the IoT application;
generates a test scenario execution report comprising test scenarios passing and failing at each sprint; and
calculates, using an AI model, the health of the IoT application based on the project end date, a number of the failing test scenarios, and the project completing on time.

2. The system of claim 1, wherein the processor is further configured to implement a connection management module to retrieve data from the plurality of components used by the IoT application.

3. The system of claim 1, wherein a device instance comprises one of attributes and properties of an IoT device, a message structure, or a plurality of rules, wherein the plurality of rules comprise value generation rules and message transmission rules.

4. The system of claim 3, wherein the value generation rules define generation of a string datum/value, a Boolean datum/value, or a numeric datum/value, wherein the value generation rules are set for at least one of IoT device attributes, properties, or message parameters.

5. The system of claim 3, wherein the value generation rules define at least one of primitive data types or composite data types.

6. The system of claim 3, wherein the message transmission rules define a condition for IoT messages that are published and transmitted from the system and create an interlinking between the IoT messages, wherein the interlinking triggers a definite sequence of transmitting at least one IoT message based on the transmitting of at least one preceding IoT message.

7. The system of claim 6, wherein the triggering comprises detecting an existence of at least one condition in the at least one preceding IoT message.

8. The system of claim 1, wherein the IoT data simulator defines a plurality of data simulation paths, wherein each data simulation path comprises a plurality of external input data sources and a plurality of output data sinks, and transforms incoming data based on at least one selected data simulation path and at least one transformation rule, wherein the incoming data is either read from at least one external input data source or is generated using value generation rules.

9. The system of claim 1, wherein the IoT application validator enables a tester to create a test scenario, populates test data corresponding to the created test scenario, wherein the test data comprise device instances, data simulation paths, and web services, and selects IoT messages to be transmitted to the IoT application, wherein the IoT messages are transmitted along with at least one parameter value.

10. The system of claim 1, wherein the AI model predicts a velocity of the project and predicts whether the project can be completed on time, based on the test scenario execution report.

11. The system of claim 1, wherein the AI model predicts resolution for issues and possible root causes for the failing test scenarios, based on previously entered resolutions and similar failures during the test scenario execution.

12. The system of claim 1, wherein the AI model monitors the execution of the test scenarios and proposes a test group with test scenarios to enable regression testing of a new test scenario, based on a previous run.

13. The system of claim 1, wherein the IoT application validator:
   validates a live IoT device and creates at least one device template based on an original equipment manufacturer's (OEM's) technical specification, wherein a device template comprises attributes, properties, message parameters, message structure, and message transmission rules;
   creates one or more live device instances using the at least one device template, wherein the one or more live device instances are created to validate a live IoT device installed in accordance with the OEM's technical specification;
   creates a plurality of test scenarios for validating the one or more live device instances, wherein a test scenario comprises test steps written according to the OEM's technical specification;
   determines a device ID from an incoming log of a live device instance of the one or more live device instances; and
   based on the device ID, identifies the test scenarios containing the live device instance for validating the one or more live device instances.

14. The system of claim 13, wherein the IoT application validator enables a playback of IoT messages received from the live device instance;
   sends the IoT messages back to the IoT application; and
   wherein a date range, a date field, or a time field of an IoT message of the IoT messages is selected to be updated during the playback.

15. A method for performing end-to-end simulation and testing of an IoT application, the method comprising:
   simulating an IoT environment based on data retrieved from a plurality of components used by the IoT application, wherein the plurality of components comprise a plurality of IoT devices, a plurality of databases, and a plurality of third-party web services, the simulating further comprising defining a plurality of device instances using at least one device template as a blueprint, wherein the plurality of device instances comprise simulated device instances and live device instances;
   transmitting to the IoT application a plurality of IoT messages, the plurality of IoT messages transmitted from the simulated IoT environment and at least one live IoT device;
   validating a behavior of the IoT application in response to the plurality of IoT messages transmitted to the IoT application, wherein the validating comprises testing one of a user interface layer, a business logic or a data layer corresponding to the IoT application using at least one device instance of the plurality of device instances;
   predicting a health of the IoT application, comprising:
      enabling a tester to create a project corresponding to the IoT application including a project start date and a project end date;
      enabling the tester to create a plurality of device templates and to create test instances using the plurality of device templates;
      enabling the tester to create a plurality of test scenarios in accordance with requirements of the IoT application;
      executing the plurality of test scenarios at regular intervals to validate the IoT application against the requirements of the IoT application;
      generating a test scenario execution report comprising test scenarios passing and failing at each sprint; and
      calculating, using an AI model implemented by a processor, the health of the IoT application based on the project end date, a number of the failing test scenarios, and the project completing on time.

16. The method of claim 15, wherein a device instance comprises one of attributes and properties of an IoT device, a message structure, or a plurality of rules, wherein the plurality of rules comprises value generation rules and message transmission rules.

17. The method of claim 16, wherein the value generation rules define generation of a string datum/value, a Boolean logic datum/value, or a numeric datum/value, wherein the value generation rules are set for at least one of IoT device attributes, properties, or message parameters.

18. The method of claim 16, wherein the value generation rules define at least one of primitive data types or composite data types.

19. The method of claim 16, wherein the message transmission rules define a condition for IoT messages that are published and transmitted from the system and create an interlinking between the IoT messages, wherein the interlinking triggers a definite sequence of transmitting at least one IoT message based on the transmitting of at least one preceding IoT message.

20. The method of claim 19, wherein the triggering comprises detecting an existence of at least one condition in the at least one preceding IoT message.

21. The method of claim 15, wherein the simulating further comprises:
   defining a plurality of data simulation paths, wherein each data simulation path comprises a plurality of external input data sources and a plurality of output data sinks; and
   transforming incoming data based on at least one selected data simulation path and at least one transformation rule, wherein the incoming data is either read from at least one external input data source or is generated using value generation rules.

22. The method of claim 15, wherein the transmitting further comprises:
   enabling a tester to create a test scenario;
   populating test data corresponding to the created test scenario, wherein the test data comprise device instances, data simulation paths, and web services; and
   selecting IoT messages to be transmitted to the IoT application, wherein the IoT messages are transmitted with at least one parameter value.

23. The method of claim 15, wherein the AI model predicts a velocity of the project and predicts whether the project can be completed on time, based on the test scenario execution report.

24. The method of claim 15, wherein the AI model predicts a resolution for issues and possible root causes for the failing test scenarios, based on previously entered resolutions and similar failures during the test scenario execution.

25. The method of claim 15, wherein the AI model monitors the execution of the test scenarios and proposes a test group with test scenarios to enable regression testing of a new test scenario, based on a previous run.

26. The method of claim 15 further comprising validating a live IoT device, wherein the validating comprises:
   creating at least one device template based on an original equipment manufacturer's (OEM's) technical specification, wherein a device template comprises attributes, properties, message parameters, message structure, and with message transmission rules;

creating one or more live device instances using the at least one device template, wherein the one or more live device instances are created to validate a live IoT device installed in accordance with the OEM's technical specification;

creating a plurality of test scenarios for validating the one or more live device instances, wherein a test scenario comprises test steps written according to the OEM's technical specification;

determining a device ID from an incoming log of a live device instance of the one or more live device instances; and based on the device ID, identifying the test scenarios containing the live device instance for validating the one or more live device instances.

27. The method of claim 26, further comprising enabling a playback of IoT messages received from the live device instance;

sending the IoT messages back to the IoT application; and wherein a date range, a date field, or a time field of an IoT message of the IoT messages is selected to be updated during the playback.

\* \* \* \* \*